(12) United States Patent
Fujita et al.

(10) Patent No.: US 9,478,683 B2
(45) Date of Patent: Oct. 25, 2016

(54) SENSOR UNIT AND SOLID-STATE IMAGING DEVICE

(71) Applicant: HAMAMATSU PHOTONICS K.K., Hamamatsu-shi, Shizuoka (JP)

(72) Inventors: Kazuki Fujita, Hamamatsu (JP); Ryuji Kyushima, Hamamatsu (JP); Harumichi Mori, Hamamatsu (JP); Haruyoshi Okada, Hamamatsu (JP); Junichi Sawada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/362,643

(22) PCT Filed: Dec. 4, 2012

(86) PCT No.: PCT/JP2012/081391
§ 371 (c)(1),
(2) Date: Jun. 4, 2014

(87) PCT Pub. No.: WO2013/084893
PCT Pub. Date: Jun. 13, 2013

(65) Prior Publication Data
US 2014/0353515 A1    Dec. 4, 2014

(30) Foreign Application Priority Data
Dec. 7, 2011    (JP) .................................. 2011-268166

(51) Int. Cl.
*G01T 1/00*    (2006.01)
*H01L 31/024*    (2014.01)
*H04N 5/32*    (2006.01)
(Continued)

(52) U.S. Cl.
CPC ............... *H01L 31/024* (2013.01); *G01T 1/00* (2013.01); *H01L 27/14618* (2013.01); *H01L 27/14623* (2013.01); *H01L 27/14663* (2013.01); *H04N 5/2257* (2013.01); *H04N 5/32* (2013.01); *H04N 5/378* (2013.01); *H01L 27/14632* (2013.01);
(Continued)

(58) Field of Classification Search
CPC .............................. G01T 1/00; H01L 31/024
See application file for complete search history.

(56) References Cited

U.S. PATENT DOCUMENTS

| | | |
|---|---|---|
| 6,667,480 B2 | 12/2003 | Kajiwara et al. |
| 2007/0280585 A1 | 12/2007 | Warashina et al. |
| 2008/0192891 A1 | 8/2008 | Mori et al. |

FOREIGN PATENT DOCUMENTS

| | | |
|---|---|---|
| CN | 1383212 | 12/2002 |
| JP | H2-031433 | 2/1990 |

(Continued)

*Primary Examiner* — David Porta
*Assistant Examiner* — Faye Boosalis
(74) *Attorney, Agent, or Firm* — Drinker Biddle & Reath LLP

(57) ABSTRACT

A sensor unit includes a metallic base member, a solid-state imaging element, and amplifier chips. The base member has a first placement surface and a second placement surface. The solid-state imaging element has a photodetecting surface, and is disposed on the first placement surface such that a rear surface and the first placement surface face each other. The amplifier chips are mounted on a substrate disposed on the second placement surface. The base member further has side wall portions facing side surfaces of the solid-state imaging element. The chips and the solid-state imaging element are electrically connected to one another via a bonding wire. The chips are thermally coupled to the base member via a thermal via of the substrate.

11 Claims, 17 Drawing Sheets

(51) Int. Cl.
*H01L 27/146* (2006.01)
*H04N 5/378* (2011.01)
*H04N 5/225* (2006.01)

(52) U.S. Cl.
CPC ............... *H01L 2224/48091* (2013.01); *H01L 2224/48137* (2013.01)

(56) References Cited

FOREIGN PATENT DOCUMENTS

| | | |
|---|---|---|
| JP | H9-055459 | 2/1997 |
| JP | 2001-128072 A | 5/2001 |
| JP | 2002-116261 A | 4/2002 |
| JP | 2003-121553 | 4/2003 |
| JP | 2004-221248 A | 8/2004 |
| JP | 2005-326403 A | 11/2005 |
| JP | 2006-214861 | 8/2006 |
| JP | 2008-053530 | 3/2008 |
| JP | 2009-018109 | 1/2009 |
| JP | 2010-164881 | 7/2010 |
| JP | 2010-281753 | 12/2010 |
| JP | 2011-066716 A | 3/2011 |
| JP | 2011-134956 | 7/2011 |
| JP | 2011-174762 A | 9/2011 |
| JP | 2011-222667 | 11/2011 |
| WO | WO 03/023843 | 3/2003 |

SENSOR UNIT AND SOLID-STATE IMAGING DEVICE

TECHNICAL FIELD

The present invention relates to a sensor unit and a solid-state imaging device.

BACKGROUND ART

An X-ray detecting device is described in Patent Document 1. This X-ray detecting device includes a sensor substrate composed of a component material of amorphous silicon, and a flexible circuit substrate on which a shift register and an integrated circuit for detection are mounted. A fluorescent material (CsI) for converting X-rays into visible light is provided on the sensor substrate.

CITATION LIST

Patent Literature

Patent Document 1: Japanese Patent Application Laid-Open No. 2005-326403

SUMMARY OF INVENTION

Technical Problem

In a solid-state imaging element having a photodetecting surface in which pixels are two-dimensionally arrayed in a plurality of rows and a plurality of columns, integration circuits and voltage holding circuits are provided for amplifying signals (electric charges) transferred from the pixels in the respective columns, to sequentially output those signals. These circuits may be, not only formed side by side with the photodetecting surface on one substrate, but also formed on a semiconductor chip different from the substrate, in some cases.

For example, for use of a medical X-ray imaging system or the like, there has been developed a solid-state imaging element which includes thin film transistors formed by depositing polycrystalline silicon, and photodiodes formed by depositing amorphous silicon on a large-area glass substrate, thereby having a photodetecting area (for example, one side is approximately 30 cm to 40 cm) which is significantly wider than that of a conventional solid-state imaging element manufactured from a single-crystal silicon wafer. For example, in a solid-state imaging element having such a configuration, in some cases, from the standpoint of an operation speed, it is preferable that integration circuits and voltage holding circuits are formed on a CMOS type semiconductor chip, and this semiconductor chip and the solid-state imaging element are connected to one another with a bonding wire or the like, than that integration circuits and voltage holding circuits are formed of polycrystalline silicon on a glass substrate.

FIG. 17 is a sectional view showing an example of a sensor unit having such a system. This sensor unit 100 includes a solid-state imaging element 101 having a plurality of pixels, and a semiconductor chip 102 having integration circuits and voltage holding circuits built-in. The solid-state imaging element 101 and the semiconductor chip 102 are mounted (die-bonded) on the surface of one wiring substrate (glass epoxy substrate) 107, and are electrically connected to one another with a bonding wire 106. A scintillator 103 is disposed on the photodetecting surface of the solid-state imaging element 101, radiation rays such as X-rays are converted into visible light, to be incident into the photodetecting surface of the solid-state imaging element 101. In addition, the sensor unit 100 may further include a housing (not shown) in which the solid-state imaging element 101 and the semiconductor chip 102 are housed. A window member through which the radiation rays reaching the sensor unit 100 are allowed to be transmitted toward the solid-state imaging element 101 is provided in the housing. Further, a base substrate 108 made of iron and a control substrate 109 are disposed on the rear surface side of the wiring substrate 107.

However, in the configuration shown in FIG. 17, the following problems occur. In the semiconductor chip 102 having the integration circuits and the voltage holding circuits built-in, its heat value is made higher than that of the solid-state imaging element 101. Then, in the configuration in which the solid-state imaging element 101 and the semiconductor chip 102 are mounted on the common wiring substrate 107 as the sensor unit 100, heat generated in the semiconductor chip 102 easily reaches the proximity of the solid-state imaging element 101 via the wiring substrate 107. As a result, there is a concern that a dark current of the photodiodes composing the respective pixels is increased, and the function of the scintillator 103 is deteriorated. In particular, in a solid-state imaging element which is formed by depositing silicon on a large-area glass substrate, the number of pixels is significantly large, and the number of semiconductor chips is increased, therefore, a heat value of the semiconductor chips is increased as well, which makes the above-described problems notable.

The present invention has been made in view of such problems, and an object thereof is to provide a sensor unit and a solid-state imaging device which are capable of reducing the effect on a solid-state imaging element due to heat generation from a semiconductor chip.

Solution to Problem

In order to solve the above-described problems, a sensor unit according to the present invention includes a base member being a metallic member having a principal surface and a rear surface, and in which a first placement region and a second placement region whose height based on the rear surface is lower than the first placement region are formed on the principal surface, a solid-state imaging element having a photodetecting surface, and a rear surface which is located on the opposite side of the photodetecting surface, and being disposed on the first placement region such that the rear surface and the first placement region face each other, and a signal readout semiconductor chip being mounted on a wiring substrate disposed on the second placement region of the base member, and amplifying a signal output from the solid-state imaging element, to output the signal, the sensor unit in which the base member further has a side wall portion facing a side surface of the solid-state imaging element, the signal readout semiconductor chip and the solid-state imaging element are electrically connected to one another via a bonding wire, and the wiring substrate has a thermal via, and the signal readout semiconductor chip is thermally coupled to the base member via the thermal via.

In this sensor unit, the solid-state imaging element is disposed on a given surface (the first placement region) of the metallic base member, and the signal readout semiconductor chip is mounted on the wiring substrate on another surface (the second placement region) of the metallic base member. In this way, the solid-state imaging element and the signal readout semiconductor chip are respectively disposed on the respective placement regions on the metallic base member with high thermal conductivity, thereby effectively diffusing heat generated in the signal readout semiconductor chip, making it hard to reach the solid-state imaging element, and therefore, it is possible to effectively reduce the effect on the solid-state imaging element due to heat generation from the semiconductor chip. Moreover, in this sensor unit, the wiring substrate has the thermal via, and the signal readout semiconductor chip is thermally coupled to the base member via the thermal via. In accordance with this configuration, it is possible to more efficiently conduct heat from the signal readout semiconductor chip to the base member, and it is possible to promote thermal diffusion in the base member.

Further, in the sensor unit, the base member has the side wall portion facing the side surface of the solid-state imaging element. In accordance with this, it is easy to perform positioning of the solid-state imaging element on the base member, and therefore, it is possible to easily improve the accuracy in wire bonding between the solid-state imaging element and the signal readout semiconductor chip.

Further, in the sensor unit, the height of the second placement region from the rear surface of the base member is lower than the height of the first placement region. In accordance with this, a difference between a height of the upper surface of the signal readout semiconductor chip mounted on the wiring substrate and a height of the upper surface of the solid-state imaging element is decreased, which makes it possible to favorably perform wire bonding.

Further, a solid-state imaging device according to the present invention includes the sensor unit described above, a housing in which the base member, the solid-state imaging element, and the signal readout semiconductor chip are housed, and a support member which supports the rear surface of the base member in the housing, and thermally couples the base member and the housing to one another. In accordance with this solid-state imaging device, it is possible to efficiently allow heat generated in the signal readout semiconductor chip to escape from the base member to the housing, and therefore, it is possible to more effectively reduce the effect on the solid-state imaging element.

Advantageous Effects of Invention

In accordance with the sensor unit and the solid-state imaging device according to the present invention, it is possible to reduce the effect on the solid-state imaging element due to heat generation from the semiconductor chip.

DESCRIPTION OF EMBODIMENTS

Hereinafter, embodiments of a sensor unit and a solid-state imaging device according to the present invention will be described in detail with reference to the accompanying drawings. In addition, the same components will be denoted by the same reference symbols in the description of the drawings, and overlapping descriptions will be omitted.

Figure 1:
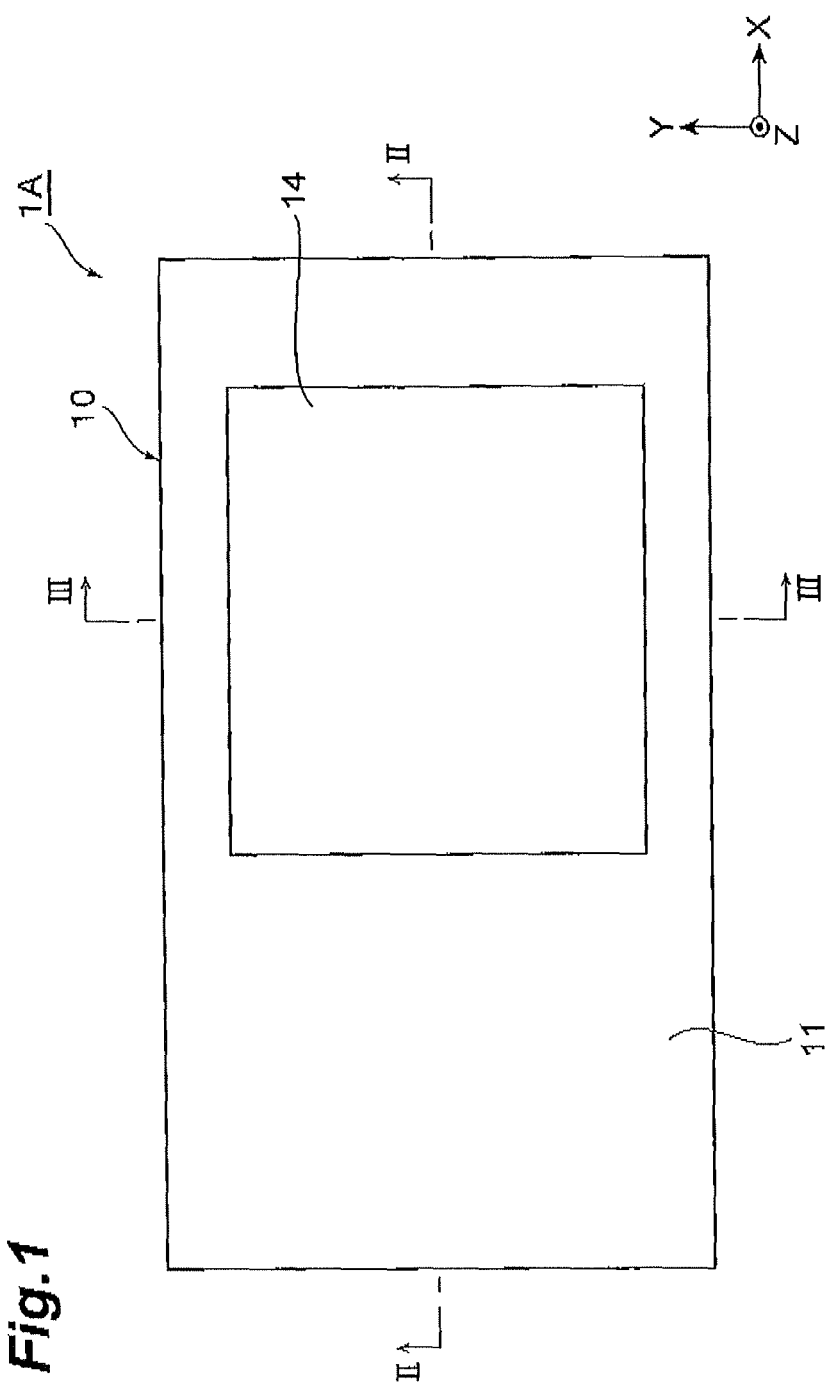
FIG. 1 is a plan view of a solid-state imaging device according to an embodiment.
Figure 2:
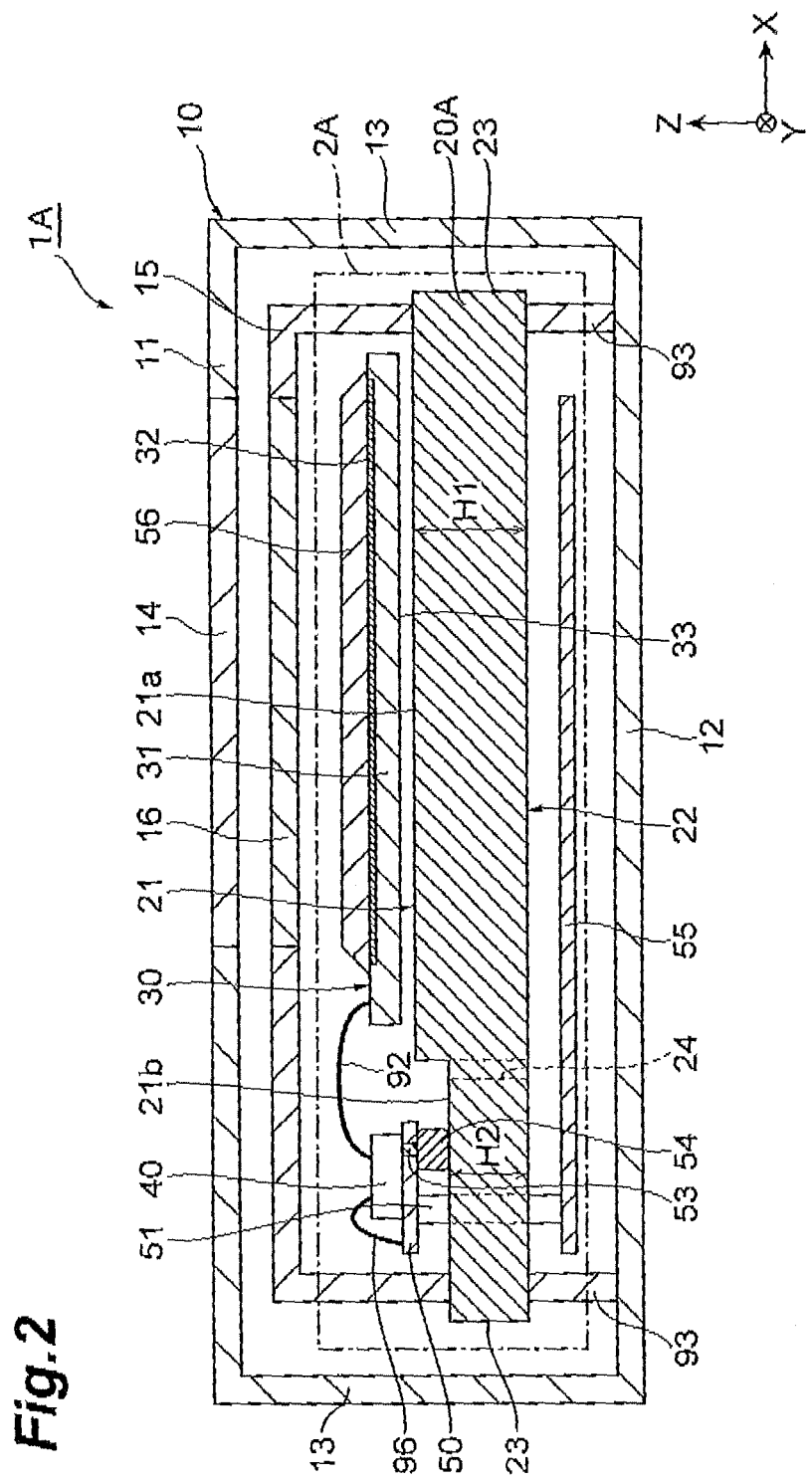
FIG. 2 is a diagram showing a cross section along the line II-II of the solid-state imaging device shown in FIG. 1.
Figure 3:
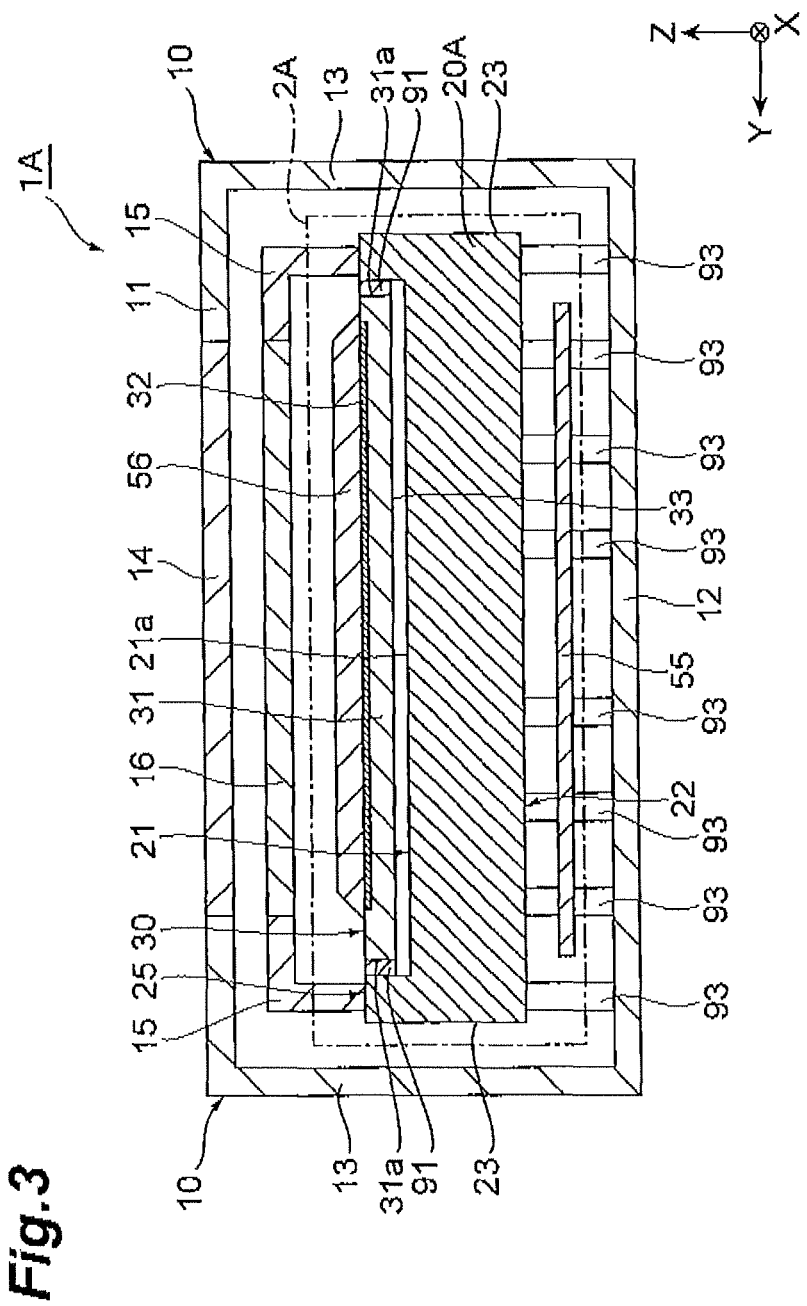
FIG. 3 is a diagram showing a cross section along the line of the solid-state imaging device shown in FIG. 1.

FIG. 1 is a plan view of a solid-state imaging device 1A according to an embodiment of the present invention. FIG. 2 is a diagram showing a cross section along the line II-II of the solid-state imaging device 1A shown in FIG. 1, and FIG. 3 is a diagram showing a cross section along the line of the solid-state imaging device 1A shown in FIG. 1. In addition, in order to facilitate understanding, the XYZ orthogonal coordinate systems are shown in FIG. 1 to FIG. 3.

As shown in FIG. 1 to FIG. 3, the solid-state imaging device 1A of the present embodiment includes a housing 10, a base member 20A, a solid-state imaging element 30, amplifier chips 40, a chip mounting substrate 50, a control substrate 55, and a scintillator 56. The housing 10 is a substantially rectangular parallelepiped hollow container having a top plate 11 and a bottom plate 12 which extend along the XY plane, and side plates 13 which extend along the Z axis, and houses the base member 20A, the solid-state imaging element 30, the amplifier chips 40, the chip mounting substrate 50, the control substrate 55, and the scintillator 56 therein. The housing 10 is composed of a material such as iron that blocks radiation rays (for example, X-rays) serving as an object to be detected by the solid-state imaging device 1A. A window member 14 for allowing radiation rays reaching the solid-state imaging device 1A to be transmitted into the housing 10 is fitted into the top plate 11 of the housing 10. The window member 14 is formed of carbon fiber, aluminum, or the like through which radiation rays incident from the Z-axis direction are transmitted.

Figure 4:
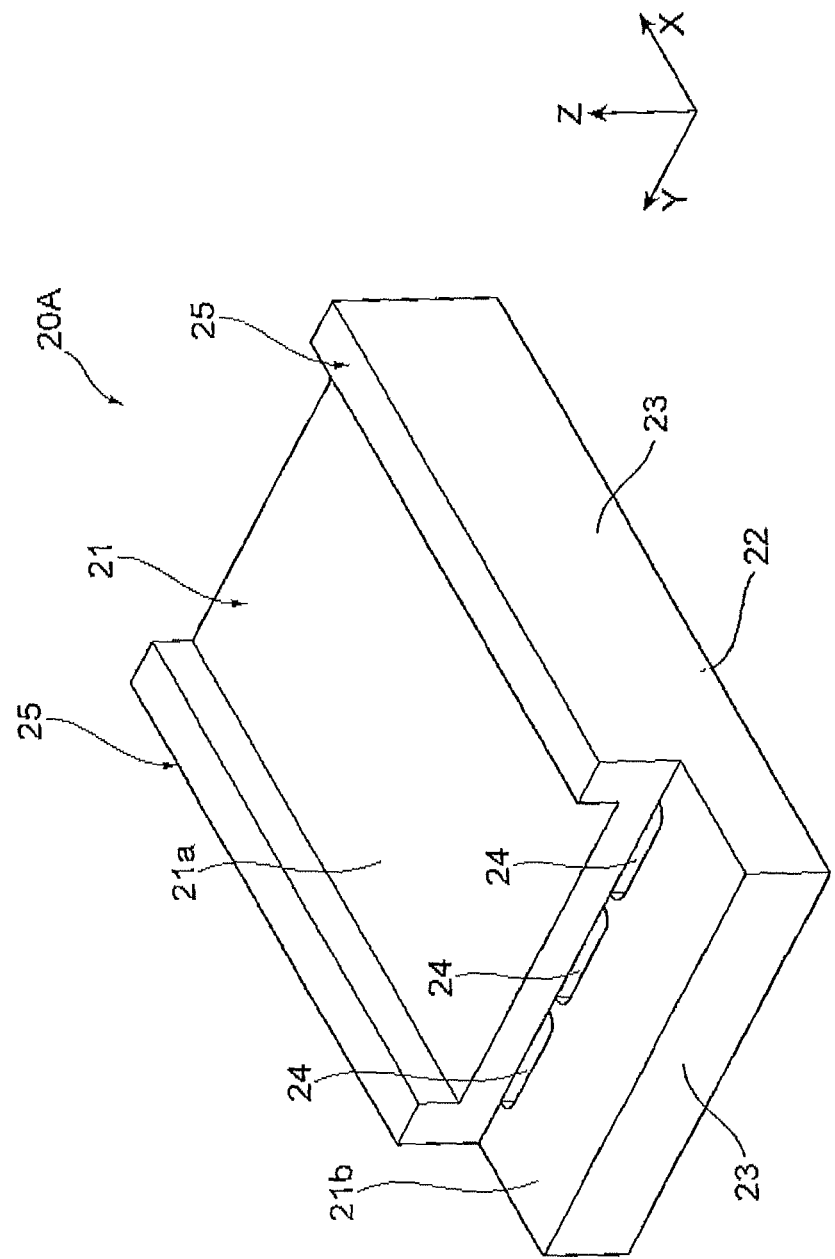
FIG. 4 is a perspective view showing an entire shape of a base member.

The base member 20A, the solid-state imaging element 30, the amplifier chips 40, the chip mounting substrate 50, the control substrate 55, and the scintillator 56 compose the sensor unit 2A in the present embodiment. The base member 20A is a member which supports the solid-state imaging element 30, the amplifier chips 40, the chip mounting substrate 50, the control substrate 55, and the scintillator 56. FIG. 4 is a perspective view showing an entire shape of the base member 20A. The base member 20A is a plate-shaped member which is substantially rectangular in a planar shape, and which is made from metal such as iron, aluminum, stainless-steel, tungsten alloy, or copper-tungsten, and has a principal surface 21 and a rear surface 22 along the XY plane, and side surfaces 23 along the Z axis. A first placement surface 21a serving as a first placement region, and a second placement surface 21b serving as a second placement region are formed side by side in the X-axis direction on the principal surface 21. The first placement surface 21a and the second placement surface 21b extend along a predetermined plane (the XY plane in the present embodiment) intersecting with the thickness direction of the base member 20A. A level difference is formed between the first placement surface 21a and the second placement surface 21b, and a height 112 of the second placement surface 21b based on the flat rear surface 22 (i.e., a thickness of the base member 20A in the second placement surface 21b) is lower (thinner) than a height H1 of the first placement surface 21a based on the rear surface 22 (a thickness of the base member 20A in the first placement surface 21a). In other words, the second placement surface 21b is located on the rear surface 22 side with respect to a virtual plane including the first placement surface 21a.

The base member 20A further has slits (holes) 24 formed between the first placement surface 21a and the second placement surface 21b. The slits 24 pass through the base member 20A from the principal surface 21 to the rear surface 22. In the present embodiment, a plurality of the slits 24 are formed in the base member 20A, and these plurality of slits 24 are formed side by side in a direction along the boundary between the first placement surface 21a and the second placement surface 21b, and are respectively formed with this direction as its longitudinal direction.

The base member 20A further has side wall portions 25. The side wall portions 25 are formed so as to protrude in the Z-axis direction from the first placement surface 21a, and are disposed around the first placement surface 21a. The side wall portions 25 face the side surfaces of the solid-state imaging element 30 (which will be described later) to be mounted on the first placement surface 21a. In the configuration shown in FIG. 4, a pair of the side wall portions 25 are formed side by side in a direction (i.e., the Y-axis direction) intersecting with the alignment direction of the first placement surface 21a and the second placement surface 21b (X-axis direction), and the first placement surface 21a is disposed between these side wall portions 25.

As shown in FIG. 2 and FIG. 3, the rear surface 22 of the base member 20A is supported by support members 93 on the bottom plate 12 of the housing 10. The support members 93 are formed of a material such as iron, aluminum, stainless-steel, tungsten alloy, or copper-tungsten. Further, the support members 93 may be formed of for example, a plurality of columnar members as shown in FIG. 3. The base member 20A is thermally coupled to the bottom plate 12 of the housing 10 with these support members 93. In addition, the support members 93 may be formed integrally with the base member 20A. Further, the support members 93 are preferably provided to at least the back side of the second placement surface 21b and its peripheral region.

The solid-state imaging element 30 is a plate-shaped element which is rectangular in a planar shape, and has a substrate 31, a photodetecting surface 32 formed on the substrate 31 along the above-described predetermined plane (the XY plane), and a rear surface 33 located on the opposite side of the photodetecting surface 32. The solid-state imaging element 30 is disposed on the first placement surface 21a such that the rear surface 33 and the first placement surface 21a face each other. Further, the scintillator 56 is disposed on the photodetecting surface 32. The scintillator 56 receives radiation incident from the window member 14 of the housing 10, and outputs scintillation light within a visible range at an intensity corresponding to an incident intensity of the radiation to the photodetecting surface 32.

The substrate 31 is favorably composed of, for example, a glass substrate, and is transparent to a wavelength of incident light to the photodetecting surface 32 (in the present embodiment, scintillation light from the scintillator 56). Then, in the present embodiment, as shown in FIG. 3, side surfaces 31a which are the part of the substrate 31 and the facing side wall portions 25 are bonded to one another via an adhesive agent 91, thereby fixing the solid-state imaging element 30 to the base member 20A. In addition, an adhesive agent and others are not provided between the rear surface 33 of the substrate 31 and the first placement surface 21a in order to prevent reflection on the photodetecting surface 32.

The amplifier chip 40 is a signal readout semiconductor chip in the present embodiment, and is composed of, for example, a C-MOS type IC chip. The amplifier chip 40 and the solid-state imaging element 30 are electrically connected to one another via the bonding wire 92. The amplifier chip 40 converts a signal (electric charge) output from the solid-state imaging element 30 into a voltage signal, and amplifies it, and outputs this voltage signal to the outside of the solid-state imaging device 1A.

Further, the amplifier chips 40 are mounted on the chip mounting substrate (wiring substrate) 50 which is disposed on the second placement surface 21b of the base member 20A. In detail, the chip mounting substrate 50 is, for example, a glass epoxy substrate, and is supported on the second placement surface 21b via a connector 51 disposed on the rear surface side. Then, the amplifier chips 40 are mounted on the surface of the chip mounting substrate 50, and the amplifier chips 40 and the chip mounting substrate 50 are electrically connected to one another via a bonding wire 96. The connector 51 passes through the base member 20A from the principal surface 21 side to the rear surface 22 side of the base member 20A, and the amplifier chips 40 are electrically connected to the control substrate 55 via the connector 51. The control substrate 55 includes circuits for controlling the operations of the amplifier chips 40 and the solid-state imaging element 30, and supplying a power source to them.

Further, as shown in FIG. 2, the chip mounting substrate 50 has a thermal via 53. The thermal via 53 is configured so as to bury a material with extremely high thermal conductivity (for example, metal) as compared with the chip mounting substrate 50 in a through hole formed in the thickness direction of the chip mounting substrate 50. Then, thermal conductive resin 54 is provided between the thermal via 53 and the second placement surface 21b, and the amplifier chips 40 are thermally coupled to the base member 20A via the thermal via 53 and the thermal conductive resin 54.

In addition, in the present embodiment, a metallic frame 15 is provided on the principal surface 21 of the base member 20A. The frame 15 covers the solid-state imaging element 30 and the amplifier chips 40 disposed on the principal surface 21, to protect them. A window member 16 is fitted into a portion of the frame 15 located between the window member 14 of the housing 10 and the photodetecting surface 32 of the solid-state imaging element 30. The window member 16 is formed of carbon fiber, aluminum, or the like through which radiation rays incident from the window member 14 are transmitted to the photodetecting surface 32. The solid-state imaging element 30 and the amplifier chips 40 are covered with this frame 15, thereby it is possible to effectively protect the solid-state imaging element 30 and the amplifier chips 40 at the time of assembling the solid-state imaging device 1A, and further, it is possible to shield the portion other than the photodetecting surface 32 of the solid-state imaging element 30 and the amplifier chips 40 from radiation or electromagnetic wave.

Figure 5:
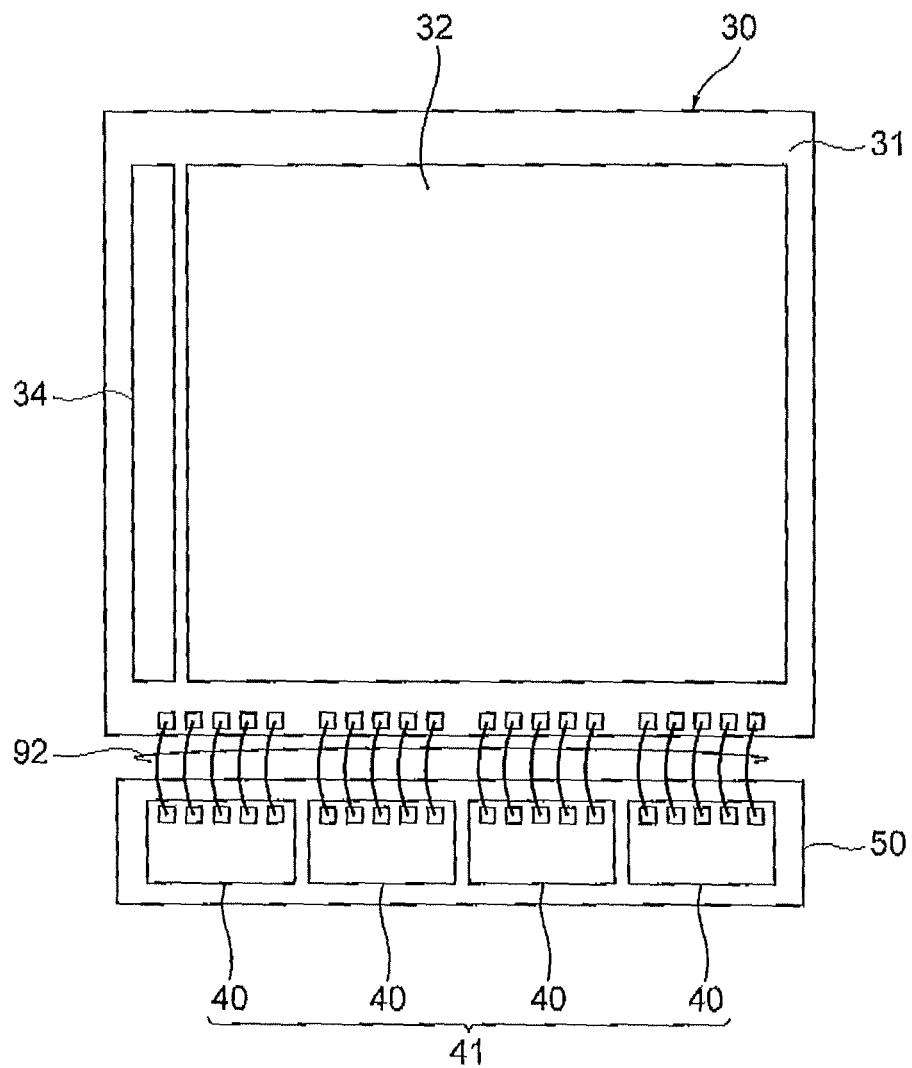
FIG. 5 is a plan view showing a solid-state imaging element and amplifier chips.
Figure 6:
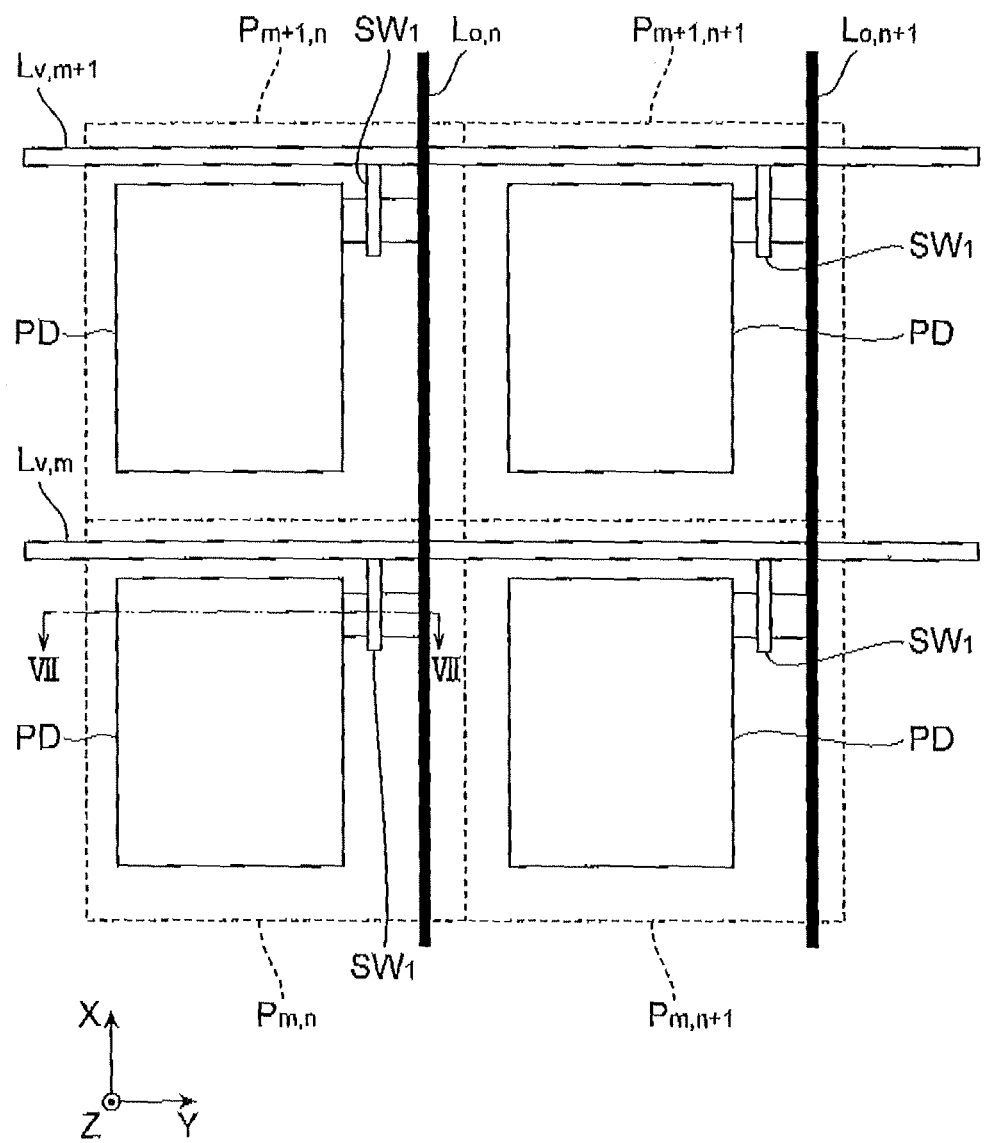
FIG. 6 is a plan view of a partial enlargement of the solid-state imaging element.
Figure 7:
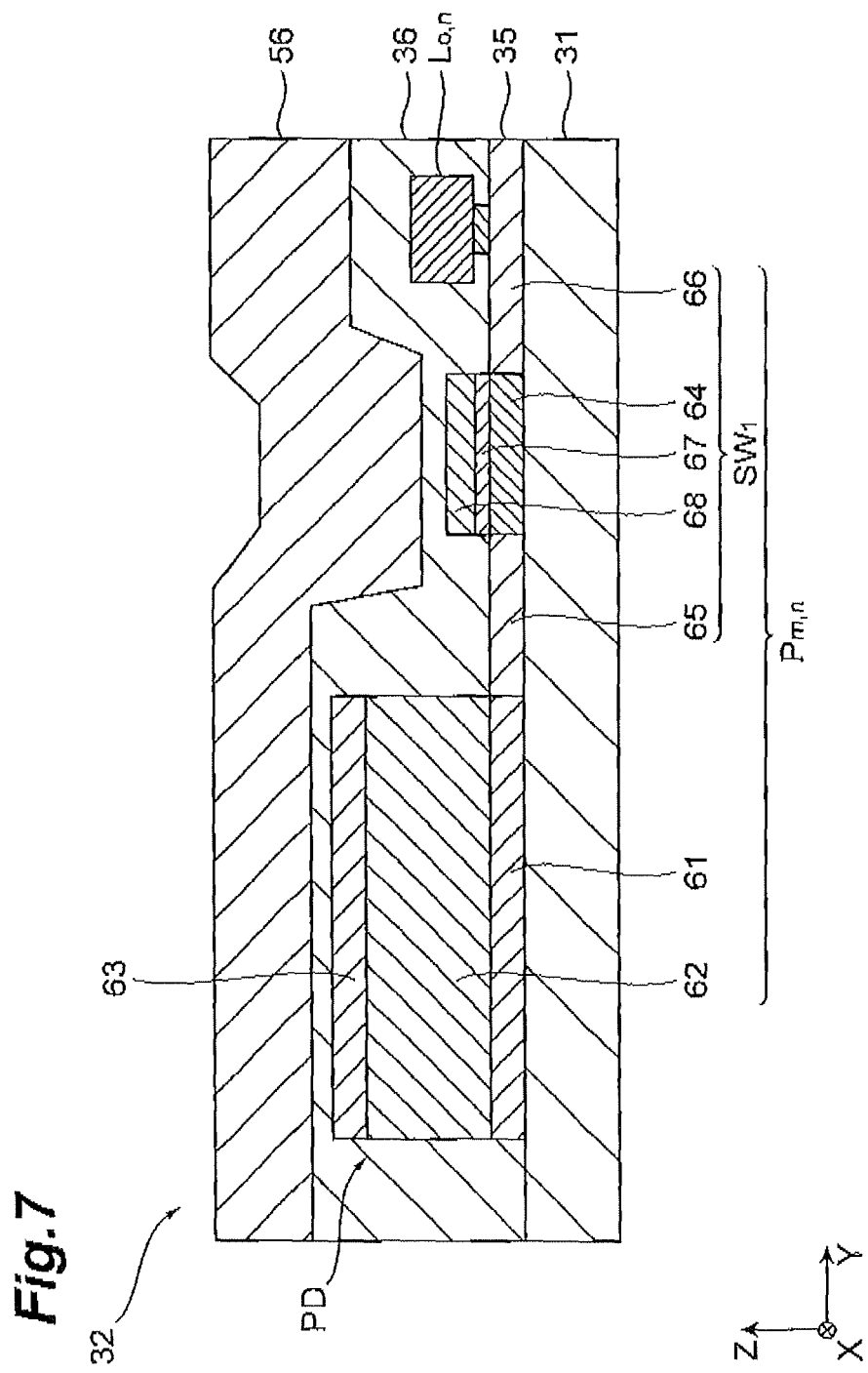
FIG. 7 is a side sectional view showing a cross section along the line VII-VII of FIG. 6.

Here, the detailed configurations of the solid-state imaging element 30 and the amplifier chips 40 will be described. The solid-state imaging device 1A of the present embodiment is used for, for example, a medical X-ray imaging system, and is particularly suitable for a system which images an X-ray image of a jaw of a subject in an imaging mode such as panoramic radiography, cephalometric radiography, or CT in dentistry medical treatment. Therefore, the solid-state imaging element 30 of the present embodiment includes thin film transistors formed by depositing polycrystalline silicon on a large-area glass substrate, and photodiodes formed by depositing amorphous silicon, and has a photodetecting area which is significantly wider (for example, one side of approximately 30 cm to 40 cm) than a conventional solid-state imaging element manufactured by a single-crystal silicon wafer, FIG. 5 to FIG. 7 are diagrams showing the configurations of the solid-state imaging element 30 and the amplifier chips 40 in the present embodiment, FIG. 5 is a plan view showing the solid-state imaging element 30 and the amplifier chips 40, and FIG. 6 is a plan view of a partial enlargement of the solid-state imaging element 30. Moreover, FIG. 7 is a side sectional view showing a cross section along the line VII-VII of FIG. 6. In addition, in order to facilitate understanding, the XYZ orthogonal coordinate systems are also shown in FIG. 5 to FIG. 7.

As shown in FIG. 5, the solid-state imaging element 30 includes the glass substrate 31, the photodetecting surface 32 manufactured on the principal surface of the glass substrate 31, and a vertical shift register 34. The vertical shift register 34 is disposed adjacent to the photodetecting surface 32.

The photodetecting surface 32 is configured such that M×N pixels are two-dimensionally arrayed in M rows and N columns. A pixel $P_{m,n}$ shown in FIG. 6 is a pixel located on the m-th row and the n-th column. Here, m is an integer of 1 or more and M or less, and n is an integer of 1 or more and N or less. In addition, in FIG. 6, the column direction is along the X-axis direction, and the row direction is along the Y-axis direction. Each of the plurality of pixels $P_{1,1}$ to $P_{M,N}$ included in the photodetecting surface 32 includes a photodiode PD and a readout switch $SW_1$. One end (one current terminal) of the readout switch $SW_1$ is connected to the photodiode PD. Further, the other end (the other current terminal) of the readout switch $SW_1$ is connected to a corresponding readout wiring line (for example, in a case of the pixel $P_{m,n}$, the n-th column readout wiring line $L_{O,n}$). A control terminal of the readout switch $SW_1$ is connected to a corresponding row selection wiring line (for example, in a case of the pixel $P_{m,n}$, the m-th row selection wiring line $L_{V,m}$).

As shown in FIG. 7, a silicon film 35 is provided on the entire surface of the glass substrate 31. Then, the photodiode PD, the readout switch $SW_1$, and the n-th column readout wiring line $L_{O,n}$ are formed on the surface of this silicon film 35. The photodiode PD, the readout switch $SW_1$, and the n-th column readout wiring line $L_{O,n}$ are covered with an insulting layer 36, and the scintillator 56 is provided on the insulting layer 36 so as to cover the entire surface of the glass substrate 31. The photodiode PD is configured so as to contain, for example, amorphous silicon.

The photodiode PD of the present embodiment has an n-type semiconductor layer 61 formed of n-type polycrystalline silicon, an i-type semiconductor layer 62 formed of i-type amorphous silicon which is provided on the n-type semiconductor layer 61, and a p-type semiconductor layer 63 formed of p-type amorphous silicon which is provided on the i-type semiconductor layer 62. Further, the readout switch $SW_1$ is a thin film transistor (TFT; Thin Film Transistor) formed of polycrystalline silicon, and has a configuration as a field-effect transistor (FET). That is, the readout switch $SW_1$ has a channel region 64, a source region 65 which is disposed along one side surface of the channel region 64, a drain region 66 which is disposed along the other side surface of the channel region 64, and a gate insulating film 67 and a gate electrode 68 which are formed on the channel region 64. The n-th column readout wiring line $L_{O,n}$ is made from metal. The scintillator 56 generates scintillation tight in accordance with incident radiation, to convert a radiation image into an optical image, and outputs this optical image to the photodetecting surface 32.

The polycrystalline silicon composing the readout switch $SW_1$ is further preferably low-temperature polycrystalline silicon. The low-temperature polycrystalline silicon is polycrystalline silicon which is formed at a process temperature of 100 to 600° C. Because the range of the process temperatures from 100 to 600° C. is a temperature range in which alkali-free glass can be used as a substrate, it is possible to manufacture the large-area photodetecting surface 32 on the glass substrate. The alkali-free glass is a plate-shaped glass having a thickness of, for example, 0.3 to 1.2 mm, and is used as so-called glass for a substrate. This alkali-free glass contains almost no alkaline component, and has a low expansion coefficient and high heat resistance, and has stable characteristics. Further, the mobility in a low-temperature polycrystalline silicon-based device is 10 to 600 cm²/Vs, and can be made higher than the mobility in amorphous silicon (0.3 to 1.0 cm²/Vs). That is, it is possible to lower the on-resistance.

In addition, in the present embodiment, the n-type semiconductor layer 61 of the photodiode PD, the channel region 64, the source region 65, and the drain region 66 of the readout switch $SW_1$ may be composed of amorphous silicon. Even in such a case, it is possible to favorably exert the operation and effect (which will be described later) by the sensor unit 2A of the present embodiment.

The pixel $P_{m,n}$ as shown in FIG. 7 is manufactured by, for example, the following processes. First, a film of amorphous silicon is formed on the glass substrate 31. As a film-forming method, for example, plasma CVD is suitable. Next, the amorphous silicon film is sequentially irradiated with a laser beam by excimer laser annealing, to make the entire surface of the amorphous silicon film into polycrystalline silicon. Thereby, the silicon film 35 is formed. Next, after an $SiO_2$ film serving as the gate insulating film 67 is formed on a partial region of the silicon film 35 which is the polycrystalline silicon layer, the gate electrode 68 is formed thereon. Next, ions are implanted into a region to be the source region 65 and the drain region 66. Thereafter, patterning of the silicon film 35 is performed, and exposure and etching are repeatedly performed, to form other electrodes, contact holes, and the like. Further, after ions are implanted into a region to be the pixel $P_{m,n}$ in the silicon film 35 so as to become n-type, i-type and p-type amorphous silicon layers (i.e., the type semiconductor layer 62 and the p-type semiconductor layer 63) are sequentially laminated thereon, to form a PIN type photodiode PD. Thereafter, a passivation film to be the insulating layer 36 is formed.

As shown in FIG. 5, the solid-state imaging device 1A includes the plurality of amplifier chips 40, and the plurality of amplifier chips 40 compose one signal connection section 41. The signal connection section 41 holds voltage values corresponding to the amounts of electric charges output from the respective pixels $P_{1,1}$ to $P_{m,n}$ of the photodetecting surface 32, and sequentially outputs the holding voltage values for each row.

Figure 8:
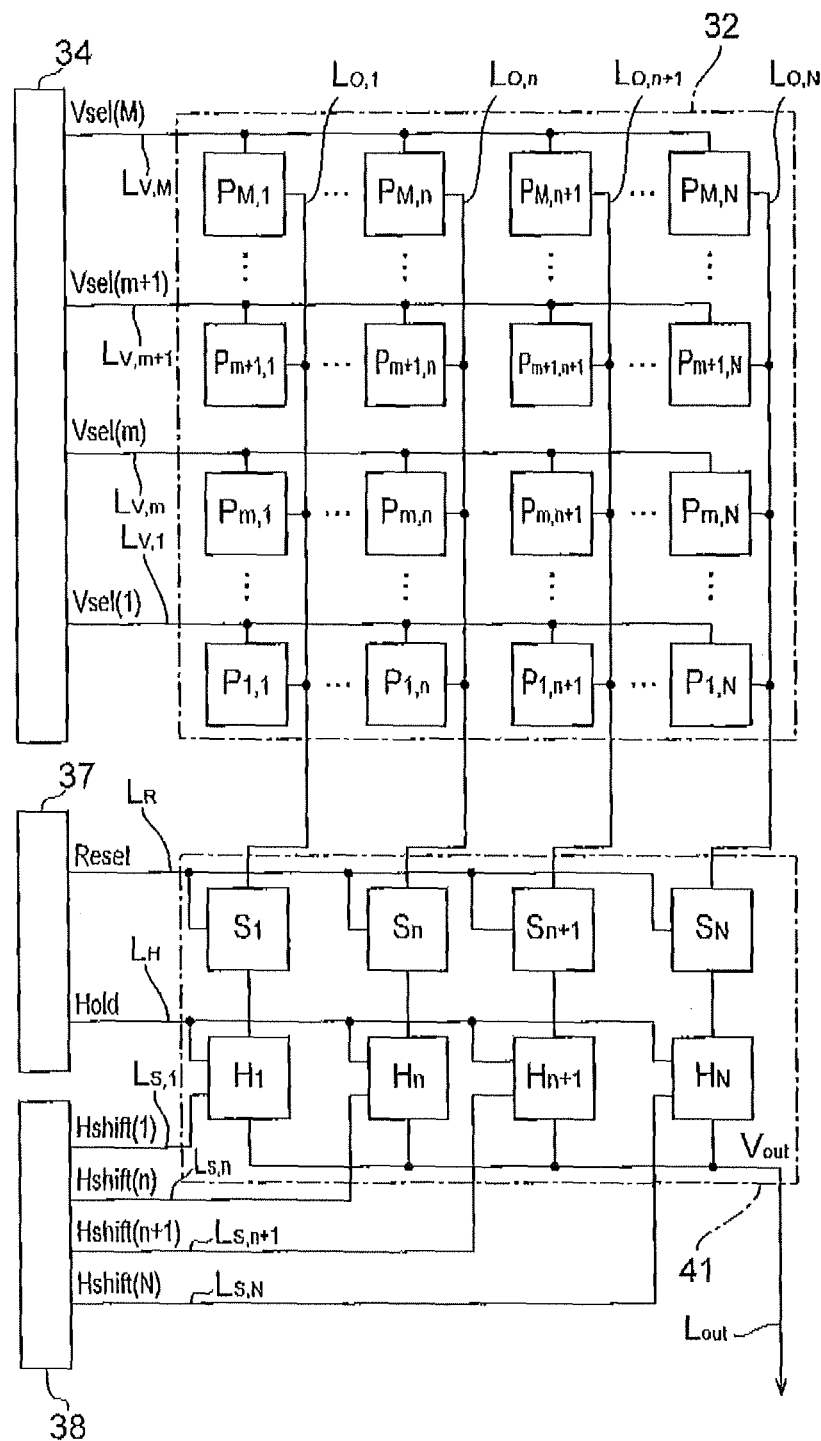
FIG. 8 is a diagram showing an internal configuration of the solid-state imaging element and the amplifier chips.

FIG. 8 is a diagram showing an internal configuration of the solid-state imaging element 30 and the amplifier chips 40. As mentioned above, the photodetecting surface 32 is formed such that M×N pixels $P_{1,1}$ to $P_{M,N}$ are two-dimensionally arrayed in M rows and N columns. Each of the M row selection wiring lines $L_{V,1}$ to $L_{V,M}$ is composed of a single wiring line extending from the first column to the N-th column, N pixels $P_{m,1}$ to $P_{m,N}$ on the m-th row are connected to the vertical shift register 34 via the m-th row selection wiring line $L_{V,m}$. In addition, as shown in FIG. 8, the vertical shift register 34 is connected to one end of the m-th row selection wiring line $L_{V,m}$.

The signal connection section 41 (i.e., the plurality of amplifier chips 40) has N integration circuits $S_1$ to $S_N$ and N holding circuits $H_1$ to $H_N$ which are provided for each column. The integration circuits $S_1$ to $S_N$ and the holding circuits $H_1$ to $H_N$ are connected to each other in series for each column. The respective integration circuits $S_1$ to $S_N$ have a common configuration. Further, the respective holding circuits $H_1$ to $H$ have a common configuration. The respective output terminals of the M pixels $P_{1,n}$ to $P_{M,n}$ are connected to the input terminal of the integration circuit $S_n$ in the signal connection section 41 via the n-th column readout wiring line $L_{O,n}$.

The integration circuits $S_1$ to $S_N$ respectively have the input terminals connected to the column readout wiring lines $L_{O,1}$ to $L_{O,N}$, and accumulate electric charges input to these input terminals, and output voltage values corresponding to the amounts of the accumulated electric charges from the output terminals to the holding circuits $H_1$ to $H_N$. The integration circuits $S_1$ to $S_N$ are connected to a controlling section 37 via a common reset wiring line $L_R$. The holding circuits $H_1$ to $H_N$ respectively have input terminals connected to the output terminals of the integration circuits $S_1$ to $S_N$, and hold voltage values input to these input terminals, and output the holding voltage values from the output terminals to a voltage output wiring line $L_{out}$. The holding circuits $H_1$ to $H_N$ are connected to the controlling section 37 via a common hold wiring line $L_H$. Further, the respective holding circuits $H_1$ to $H_N$ are connected to a horizontal shift register 38 via the first column selection wiring line $L_{S,1}$ to the N-th column selection wiring line $L_{S,N}$ respectively.

The vertical shift register 34 outputs the m-th row selection control signal Vsel(m) to the m-th row selection wiring line $L_{V,m}$, to provide this m-th row selection control signal Vsel(m) to the N pixies $P_{m,1}$ to $P_{m,N}$ on the m-th row respectively. In the vertical shift register 34, the M row selection control signals Vsel(1) to Vsel(M) are sequentially made into significant values. Further, the horizontal shift register 38 outputs column selection control signals Hshift (1) to Hshift(N) to the column selection wiring lines $L_{S,1}$ to $L_{S,N}$, and provides these column selection control signals Hshift(1) to Hshift(N) to the holding circuits $H_1$ to $H_N$. The column selection control signals Hshift(1) to Hshift(N) as well are sequentially made into significant values.

Further, the controlling section 37 outputs a reset control signal Reset to the reset wiring line $L_a$, and provides this reset control signal Reset to the N integration circuits $S_1$ to $S_N$ respectively. The controlling section 37 outputs a hold control signal Hold to the hold wiring line $L_H$, and provides this hold control signal Hold to the N holding circuits $H_1$ to $H_N$ respectively.

The effects obtained by the solid-state imaging device 1A and the sensor unit 2A of the present embodiment having the above-described configurations will be described.

In the solid-state imaging device 1A and the sensor unit 2A of the present embodiment, the solid-state imaging element 30 is disposed on a given surface (the first placement surface 21a) of the metallic base member 20A, and the amplifier chips 40 are mounted on the chip mounting substrate 50 on another surface (the second placement surface 21b) of the metallic base member 20A. In this way, the solid-state imaging element 30 and the amplifier chips 40 are respectively disposed on the respective placement surfaces 21a and 21b on the metallic base member 20A with high thermal conductivity, thereby effectively diffusing heat generated in the amplifier chips 40, making it hard to reach the solid-state imaging element 30, and therefore, it is possible to effectively reduce the effect on the solid-state imaging element 30 due to heat generation from the amplifier chips 40.

Moreover, in this sensor unit 2A, the chip mounting substrate 50 has the thermal via 53, and the amplifier chip 40 is thermally coupled to the base member 20A via the thermal via 53. In accordance with this configuration, it is possible to more efficiently conduct heat from the amplifier chips 40 to the base member 20A, and it is possible to promote heat diffusion in the base member 20A.

Further, in the solid-state imaging device 1A and the sensor unit 2A, the base member 20A has the side wall portions 25 facing the side surfaces of the solid-state imaging element 30. In accordance with this, it is easy to perform positioning of the solid-state imaging element 30 on the base member 20A, and therefore, it is possible to easily improve the accuracy of wire bonding between the solid-state imaging element 30 and the amplifier chips 40.

Further, in the solid-state imaging device 1A and the sensor unit 2A, the height H2 of the second placement surface 21b based on the rear surface 22 is lower than the height H1 of the first placement surface 21a. In accordance with this, a difference between a height of the upper surface of the amplifier chips 40 mounted on the chip mounting substrate 50 and a height of the upper surface of the solid-state imaging element 30 is decreased, which makes it possible to favorably perform wire bonding.

Further, as in the present embodiment, in the solid-state imaging device 1A and the sensor unit 2A, the base member 20A preferably has the slits 24 which are formed between the first placement surface 21a and the second placement surface 21b, and passes through the base member 20A from the principal surface 21 to the rear surface 22. By forming the slits 24 in the base member 20A, it is possible to block heat conduction between the first placement surface 21a and the second placement surface 21b, and therefore, it is possible to more effectively reduce the effect on the solid-state imaging element 30 due to heat generation from the amplifier chips 40.

Further, as in the present embodiment, the solid-state imaging device 1A and the sensor unit 2A may include the scintillator 56 which is disposed on the solid-state imaging element 30, and outputs light at an intensity corresponding to incident intensity of radiation to the photodetecting surface 32. In the solid-state imaging device 1A and the sensor unit 2A, the solid-state imaging element 30 is disposed on the first placement surface 21a such that the rear surface 33 of the solid-state imaging element 30 and the first placement surface 21a face each other. Accordingly, in some cases, radiation rays incident into the scintillator 56 may partially pass through the solid-state imaging element 30, to reach the first placement surface 21a. Even in such a case, because the base member 20A is made of metal in the sensor unit 2A, it is possible to prevent the radiation from passing through the base member 20A. For this reason, for example, even in the case where the control substrate 55 and the like are disposed on the rear surface side of the base member 20A, it is possible to sufficiently protect the control substrate 55 and the like from radiation.

Further, as in the present embodiment, in the solid-state imaging device 1A and the sensor unit 2A, in the case where the solid-state imaging element 30 has the substrate 31 which is transparent to a wavelength of incident light onto the photodetecting surface 32, it is preferable that the side surfaces of the solid-state imaging element 30 and the side wall portions 25 are bonded to one another, thereby fixing the solid-state imaging element 30 to the base member 20A. For this reason, it is possible to omit placement of an adhesive agent between the rear surface 33 of the solid-state imaging element 30 and the first placement surface 21a of the base member 20A, and therefore, it is possible to prevent an adhesive agent from being reflected on the photodetecting surface, and it is possible to suppress heat conducted from the base member 20A to the rear surface 33 of the solid-state imaging element 30 to a low level.

Further, as in the present embodiment, it is preferable that the thermal conductive resin 54 is interposed between the thermal via 53 of the chip mounting substrate 50 and the second placement surface 21b of the base member 20A. Thereby, it is possible to more efficiently conduct heat generated in the amplifier chips 40 to the base member 20A.

Further, as in the present embodiment, it is preferable that the solid-state imaging device 1A includes the support member 93 which supports the rear surface 22 of the base member 20A in the housing 10, and thermally couples the base member 20A and the housing 10 to each other. Thereby, it is possible to efficiently allow heat generated in the amplifier chips 40 to escape from the base member 20A to the housing 10, and therefore, it is possible to more effectively reduce the effect on the solid-state imaging element 30. In addition, the support members 93 are preferably provided to at least the back side of the second placement surface 21b, and further, an area proportion of the support members 93 in a region within the rear surface 22 corresponding to a back side of the second placement surface 21b is preferably higher than an area proportion of the support members 93 in a region within the rear surface 22 corresponding to a back side of the first placement surface 21a. Thereby, it is possible to more efficiently allow heat generated in the amplifier chips 40 to escape from the base member 20A to the housing 10.

Figure 9:
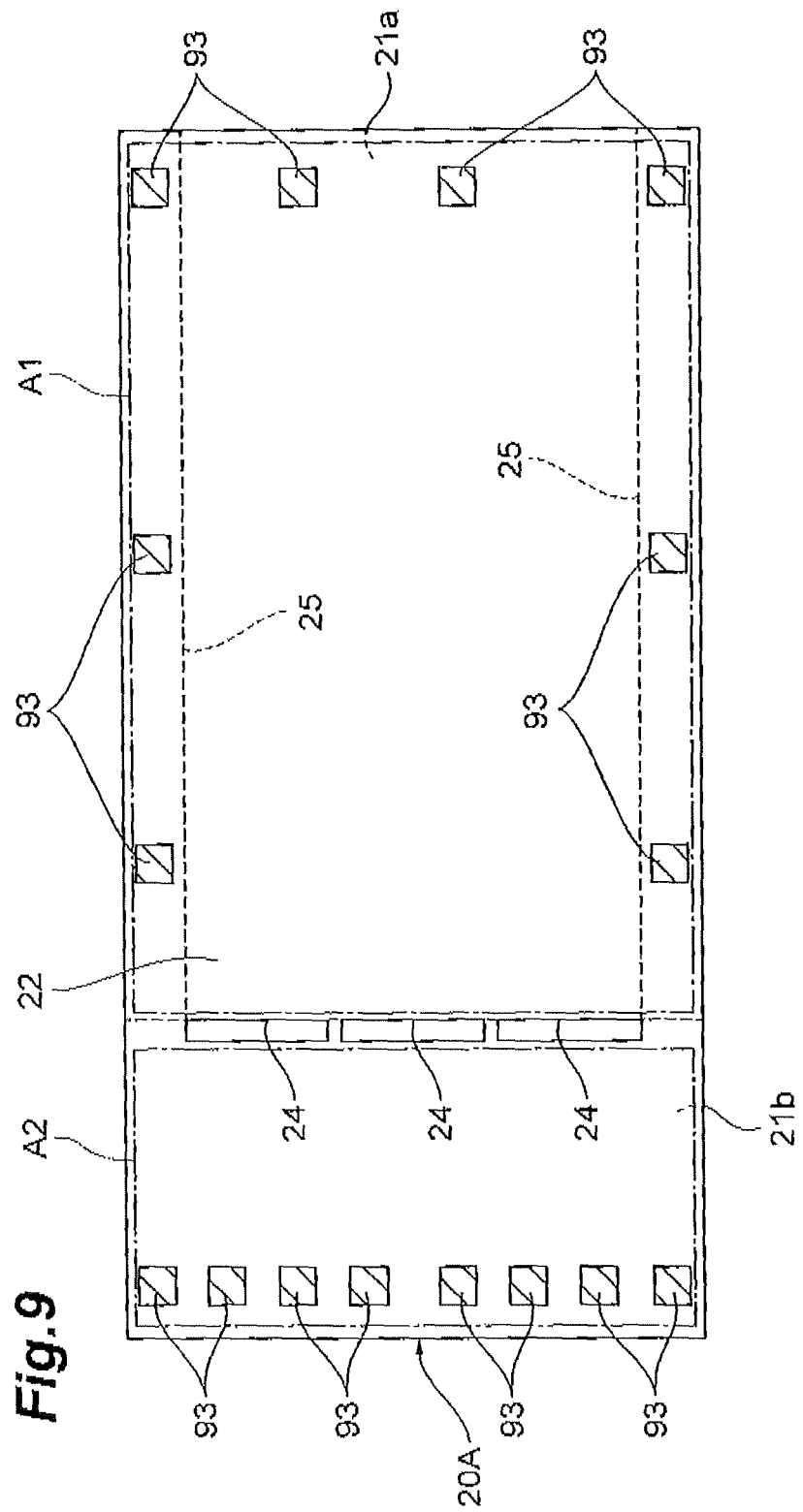
FIG. 9 is a diagram showing a rear surface of the base member.

Here, FIG. 9 is a diagram showing the rear surface 22 of the base member 20A and the support members 93 attached to the rear surface 22. In the present embodiment, a plurality of the columnar support members 93 are provided. Then, some of the plurality of support members 93 are disposed on the inner side of a region (a region A1 in the diagram) in the rear surface 22 corresponding to a back side of the first placement surface 21a, and the remaining portions are disposed on the inner side of a region (a region A2 in the diagram) in the rear surface 22 corresponding to a back side of the second placement surface 21b. In addition, the region A1 includes the periphery of the back side of the first placement surface 21a as well, for example, a region corresponding to a back side of the side wall portions 25 is also included. In the same way, the region A2 includes the periphery of the back side of the second placement surface 21b as well.

In the example shown in FIG. 9, the number of the support members 93 in the region A2 and the number of the support members 93 in the region A1 are equal to one another, and further, all the cross sectional areas of these support members 93 are equal to each other. Then, the area of the region A2 is smaller than the area of the region A1. Accordingly, an area proportion of the attachment region of the support members 93 in the region A2 is higher than an area proportion of the attachment region of the support members 93 in the region A1.

In addition, the plurality of support members 93 are disposed side by side on the peripheral edge portion of the rear surface 22 in the example shown in FIG. 9, however, the layout of the plurality of support members 93 is not limited to this way. Further, for example, the relationship between the area proportions of the support members 93 in the rear surface 22 as described above may be realized by making the cross sectional area of the support member 93 in the region A2 larger than the cross sectional area of the support member 93 in the region A1, or by making the number of the support members 93 in the region A2 greater than the number of the support members 93 in the region A1.

(First Modified Example)

Figure 10:
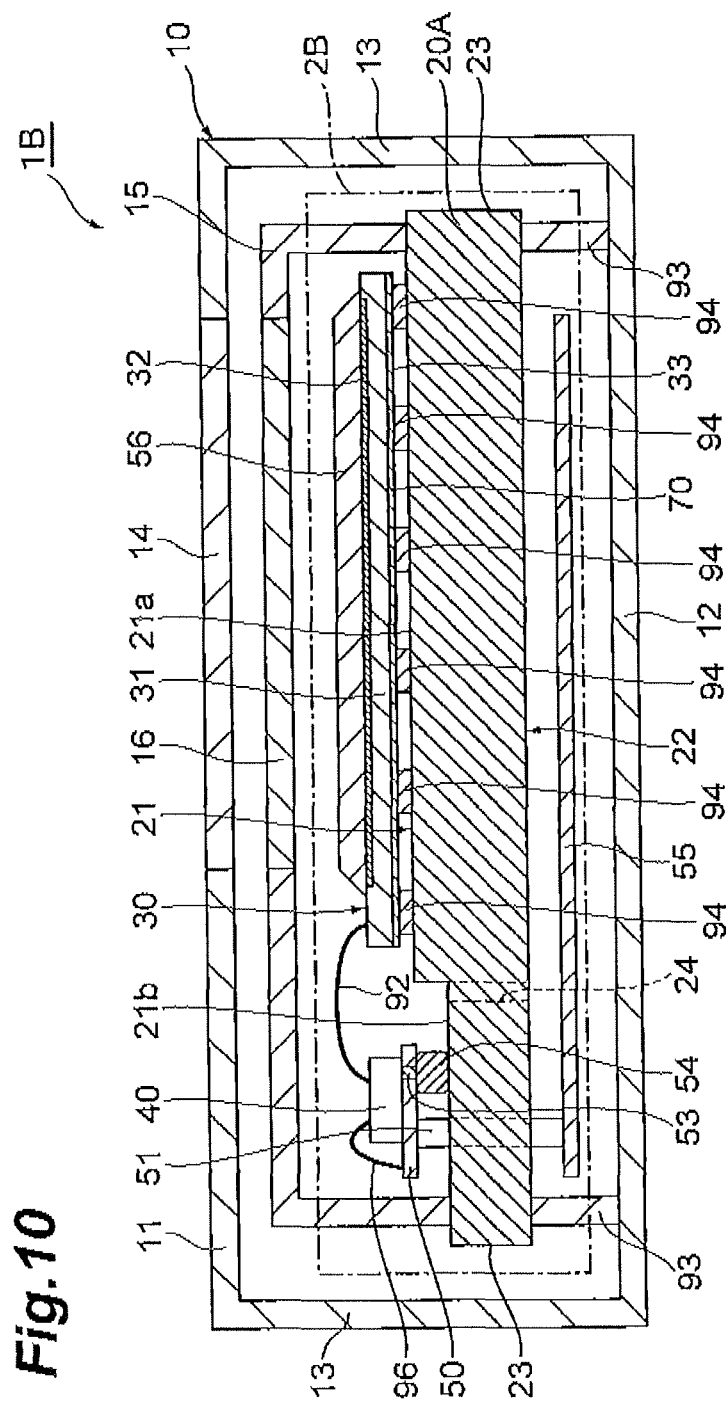
FIG. 10 is a sectional view showing a configuration of a sensor unit according to a first modified example, and shows a cross section corresponding to FIG. 2.

Next, modified examples of the above-described embodiment will be described. FIG. 10 is a sectional view showing a configuration of a solid-state imaging device 1B according to a first modified example of the above-described embodiment, and shows a cross section corresponding to FIG. 2 in the above-described embodiment.

A sensor unit 2B included in the solid-state imaging device 1B of the present modified example further includes a light shielding film (or a light shielding tape) 70 in addition to the configuration of the sensor unit 2A of the above-described embodiment. The light shielding film 70 is formed on the rear surface 33 of the glass substrate 31 of the solid-state imaging element 30, and blocks light which is output from the scintillator 56, and is likely to pass through the glass substrate 31. Further, an adhesive agent 94 is disposed between the light shielding film 70 and the first placement surface 21a, and the solid-state imaging element 30 and the base member 20A are fixed to one another with the adhesive agent 94.

As in the present modified example, the sensor unit may further have the light shielding film 70 on the rear surface 33 of the solid-state imaging element 30. Thereby, it is possible to effectively prevent a component disposed between the solid-state imaging element 30 and the base member 20A from being reflected on the photodetecting surface 32, and therefore, for example, as in the present modified example, the adhesive agent 94 may be disposed between the solid-state imaging element 30 and the base member 20A, to be able to more firmly fix the solid-state imaging element 30 to the base member 20A.

(Second Modified Example)

Figure 11:
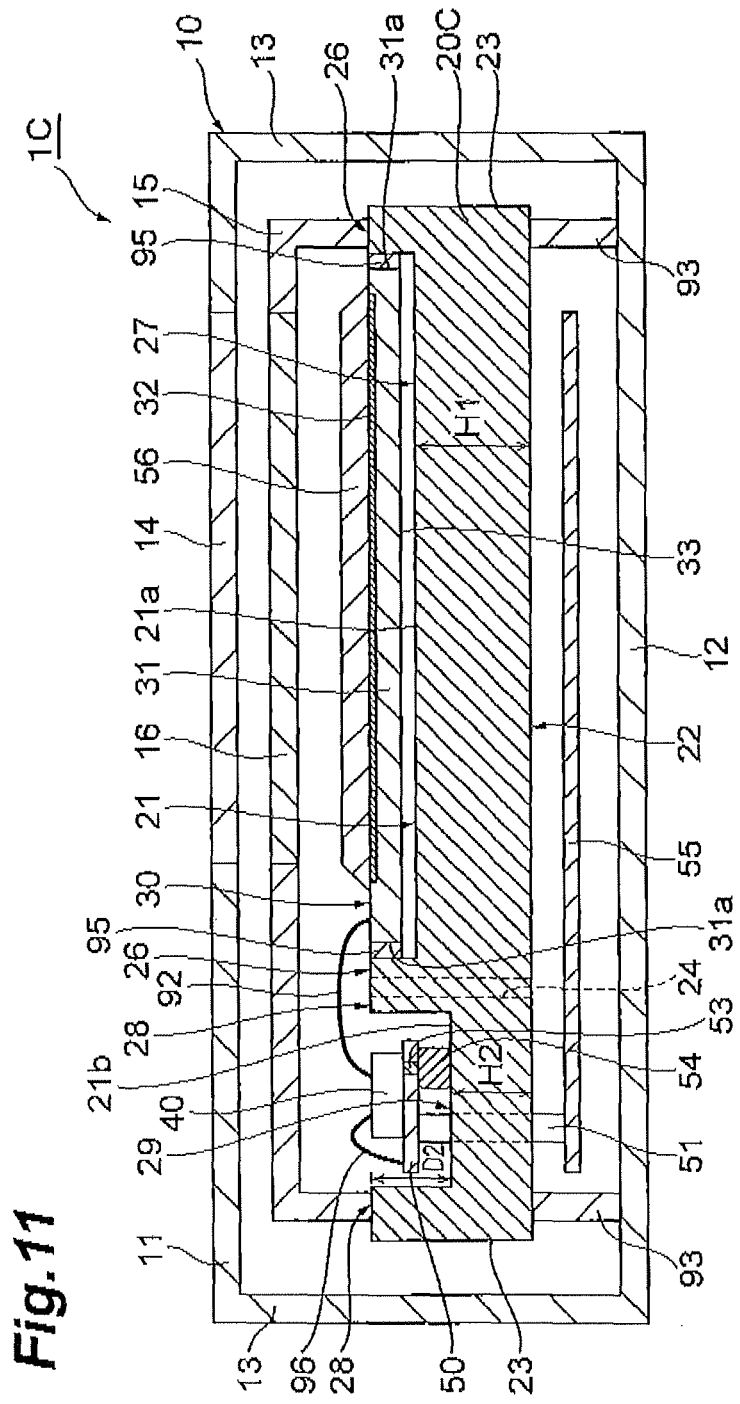
FIG. 11 is a sectional view showing a configuration of a sensor unit according to a second modified example, and shows a cross section corresponding to FIG. 2.
Figure 12:
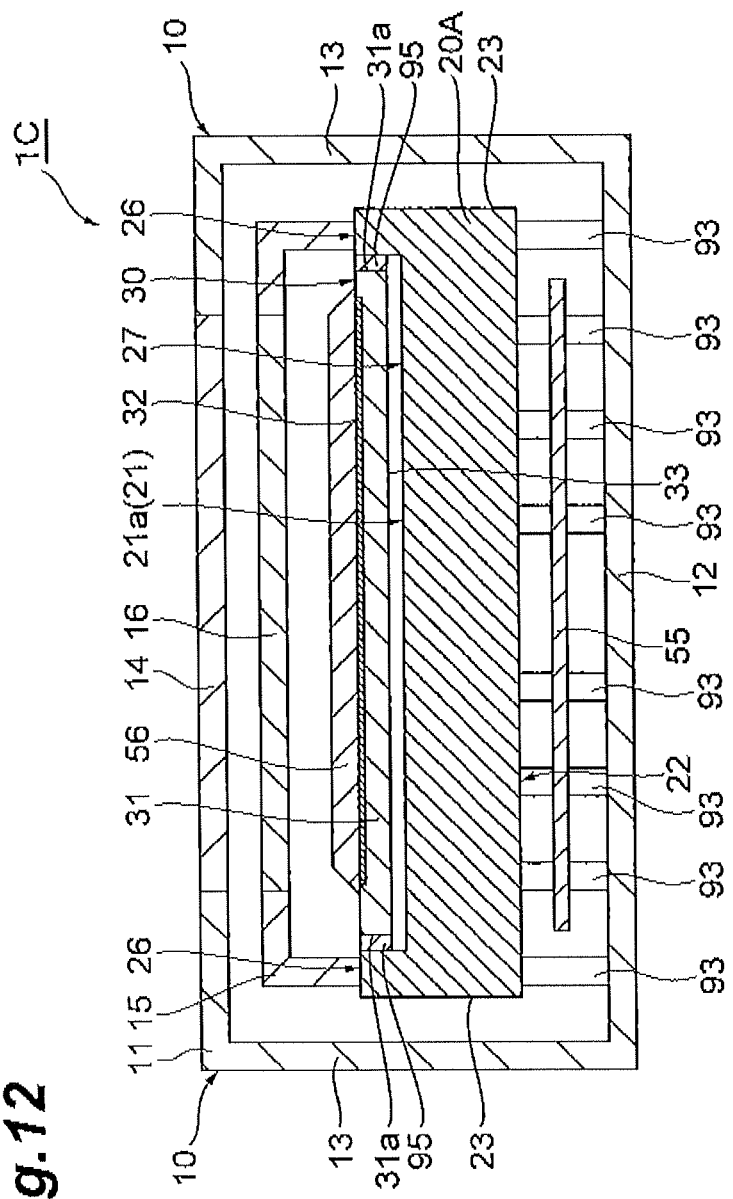
FIG. 12 is a sectional view showing a configuration of the sensor unit according to the second modified example, and shows a cross section corresponding to FIG. 3.

Next, a second modified example of the above-described embodiment will be described. FIG. 11 and FIG. 12 are sectional views showing configurations of a solid-state imaging device 1C according to a modified example. FIG.

Figure 13:
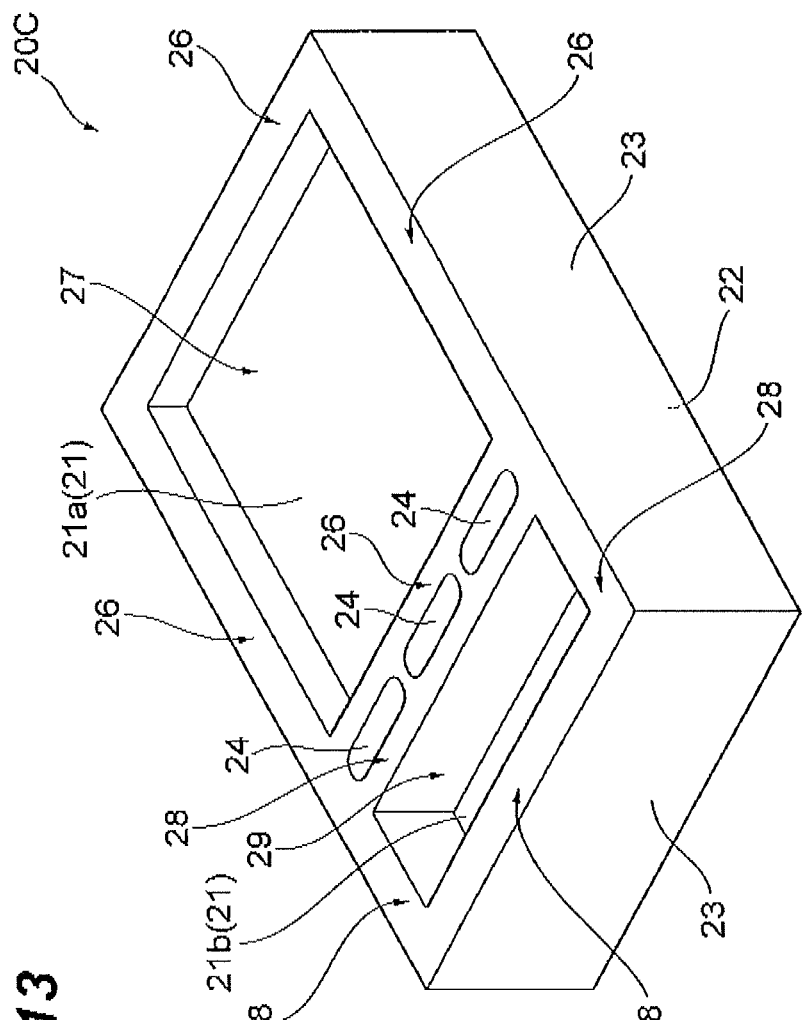
FIG. 13 is a perspective view showing an entire shape of a base member included in the sensor unit according to the second modified example.

11 shows a cross section corresponding to FIG. 2 in the above-described embodiment, and FIG. 12 shows a cross section corresponding to FIG. 3 in the above-described embodiment. Further, FIG. 13 is a perspective view showing an entire shape of a base member 20C included in the solid-state imaging device 1C.

The base member 20C of the present modified example has, in the same way as the base member 20A of the above-described embodiment, the principal surface 21 and the rear surface 22 along the XY plane, and the side surfaces 23 along the Z axis. Then, the first placement surface 21a and the second placement surface 21b are formed side by side in the X-axis direction on the principal surface 21. In the present embodiment as well, the height H2 of the second placement surface 21b based on the flat rear surface 22 (i.e., a thickness of the base member 20C in the second placement surface 21b) is lower (thinner) than the height H1 of the first placement surface 21a based on the rear surface 22 (a thickness of the base member 20C in the first placement surface 21a).

However, in the present modified example, all the four sides of the first placement surface 21a are surrounded by side wall portions 26 protruding in the Z-axis direction from the first placement surface 21a. Thereby, a first depressed portion 27 with the first placement surface 21a serving as its bottom surface and the side wall portions 26 serving as its side surfaces is formed in the principal surface 21. In the same way as this, all the four sides of the second placement surface 21b are surrounded by side wall portions 28 protruding in the Z-axis direction from the second placement surface 21b. Thereby, a second depressed portion 29 with the second placement surface 21b serving as its bottom surface and the side wall portions 28 serving as its side surfaces is formed in the principal surface 21.

As shown in FIG. 11 and FIG. 12, the side wall portions 26 of the first depressed portion 27 face the four side surfaces of the solid-state imaging element 30 to be mounted on the first placement surface 21a. In the present modified example, the solid-state imaging element 30 is fitted into the first depressed portion 27, and the four side surfaces 31a of the substrate 31 of the solid-state imaging element 30 and the facing side wall portions 26 are bonded to one another via an adhesive agent 95, thereby firmly fixing the solid-state imaging element 30 to the base member 20C.

As in the present modified example, the base member 20C may have the first depressed portion 27 with the first placement surface 21a serving as its bottom surface and the side wall portions 26 serving as its side surfaces, and the second depressed portion 29 with the second placement surface 21b serving as its bottom surface. Thereby, it is possible to sufficiently secure the thickness of the base member 20C in the region other than the first placement surface 21a and the second placement surface 21b, and therefore, it is possible to farther improve the radiation shielding effect by the base member 20C. Further, the solid-state imaging element 30 is fitted into the first depressed portion 27, thereby it is possible to easily and accurately perform positioning of the photodetecting surface 32.

Further, in the present modified example, a distance between the rear surface 22 of the base member 20C and the second placement surface 21b (i.e., a thickness of the base member 20C in the second placement surface 21b) H2 is preferably greater than a depth D2 of the second depressed portion 29. Thereby, it is possible to sufficiently secure the thickness of the base member 20C in the first placement surface 21a and the second placement surface 21b as well, and therefore, it is possible to further improve the radiation shielding effect by the base member 20C.

(Third Modified Example)

Figure 14:
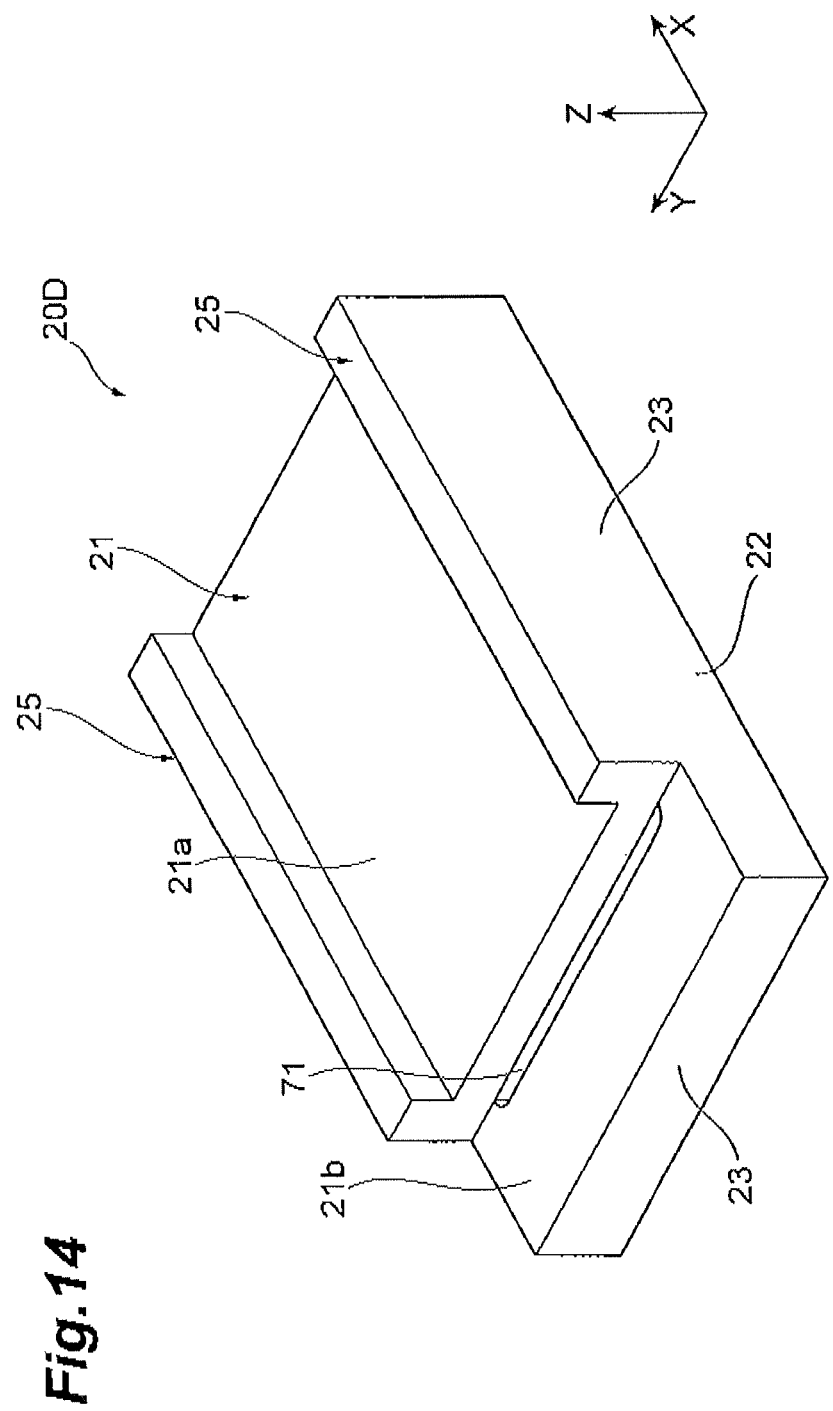
FIG. 14 is a perspective view showing a varied shape of the base member as a third modified example.
Figure 15:
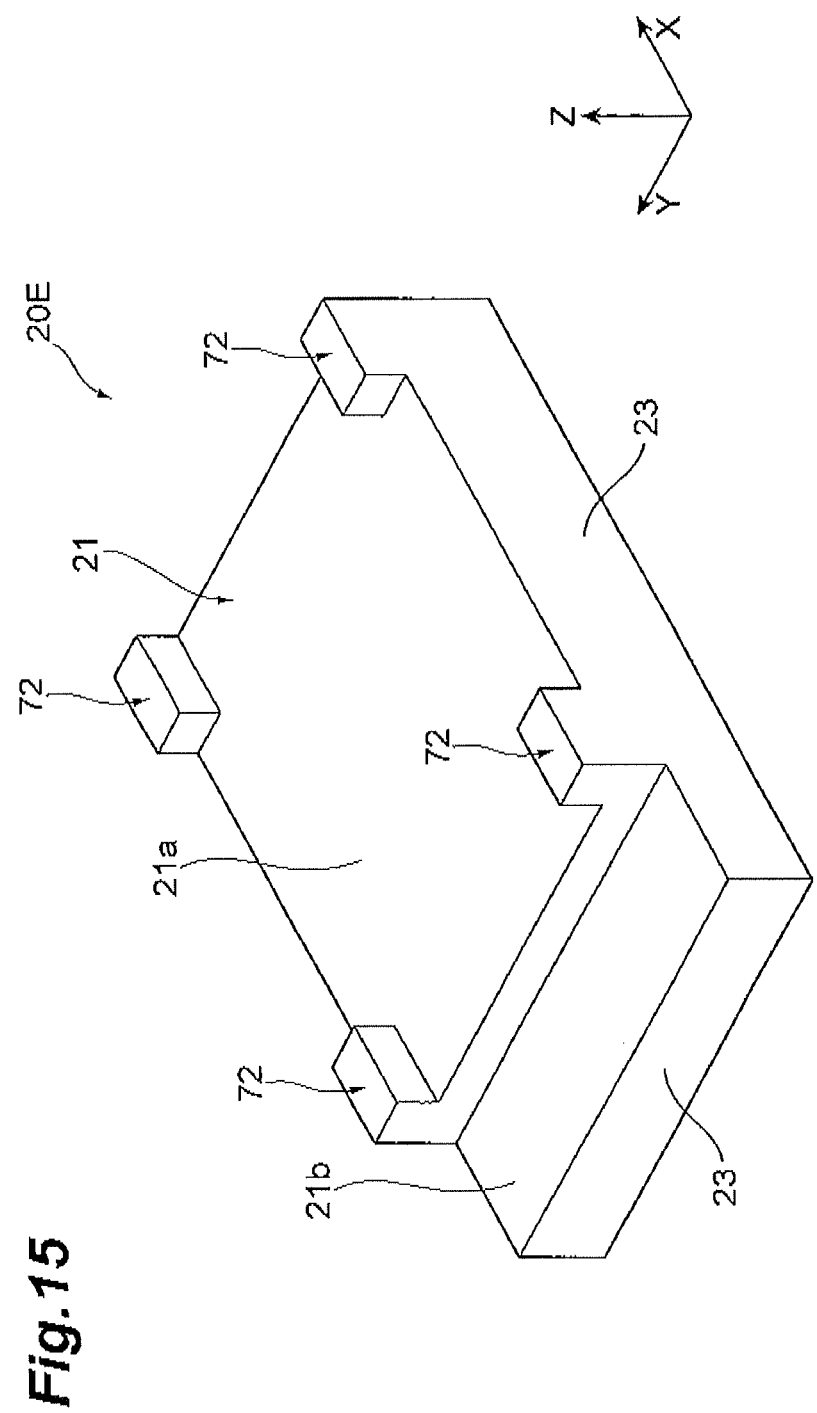
FIG. 15 is a perspective view showing a varied shape of the base member as the third modified example.
Figure 16:
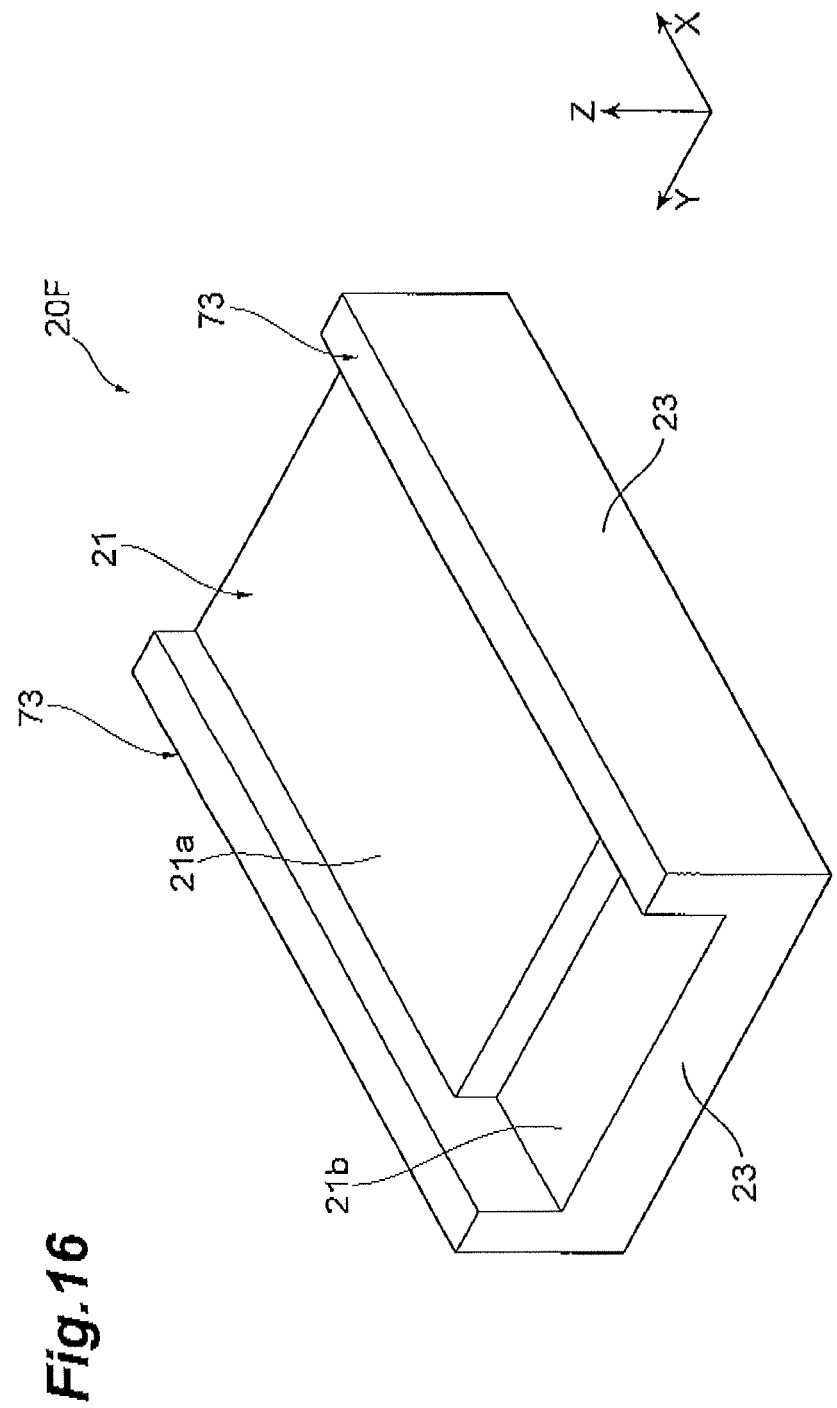
FIG. 16 is a perspective view showing a varied shape of the base member as the third modified example.
Figure 17:
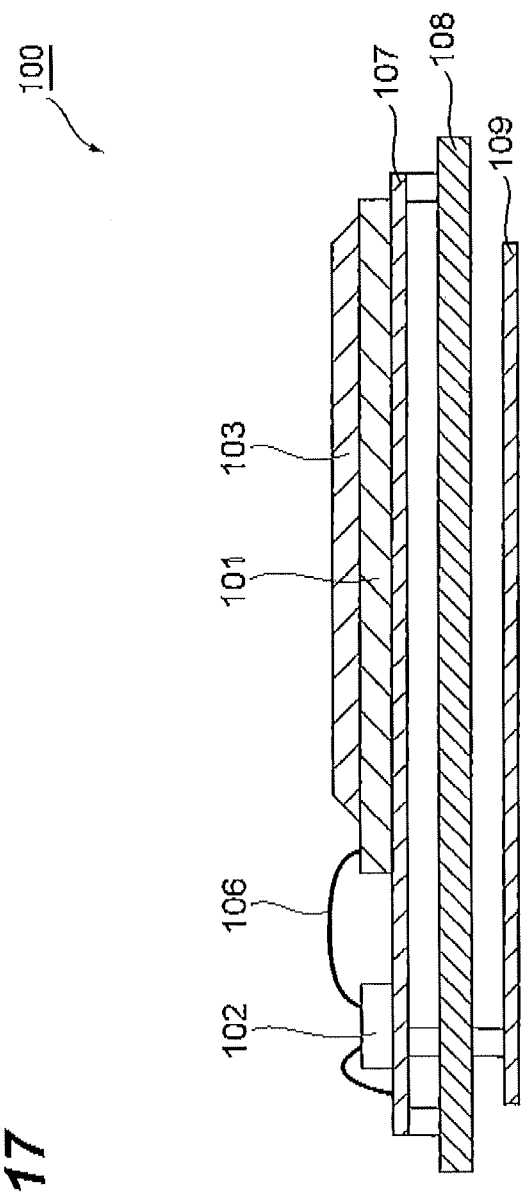
FIG. 17 is a sectional view showing a configuration example of a sensor unit.

FIG. 14 to FIG. 16 are perspective views showing varied shapes of base members as a third modified example of the above-described embodiment. A point of difference between a base member 20D shown in FIG. 14 and the base member 20A of the first embodiment is the shape of the slit. The base member 20D of the present modified example has a slit (hole) 71 in place of the slits 24 of the first embodiment. The slit 71 is formed between the first placement surface 21a and the second placement surface 21b, and passes through the base member 20D from the principal surface 21 to the rear surface 22. In the present embodiment, the one slit 71 is formed in the base member 20D, and the slit 71 is formed with, a direction (i.e., the Y-axis direction) along the boundary between the first placement surface 21a and the second placement surface 21b as its longitudinal direction, and has a length equivalent to the width of the first placement surface 21a in the direction.

As the base member 20D shown in FIG. 14, a slit formed in the base member may be singular, or may have another varied shape. In addition, a slit in the base member is not indispensable, and even in the case where no slit is formed, it is possible to sufficiently obtain the effect by the above-described first embodiment. Further, the configuration of blocking heat conduction between the first placement surface and the second placement surface is not limited to the slit passing through the base member, for example, it may be a groove (depressed portion) formed in at least one of the surface and the rear surface of the base member between the first placement surface and the second placement surface.

A point of difference between base members 20E and 20F shown in FIG. 15 and FIG. 16 and the base member 20A of the first embodiment is the shapes of the side wall portions and the presence or absence of a slit. The base member 20E shown in FIG. 15 has side wall portions 72 in place of the side wall portions 25 in the first embodiment. The side wall portions 72 are formed so as to protrude in the Z-axis direction from the first placement surface 21a, and are disposed discretely around the first placement surface 21a (for example, in the four corners of the first placement surface 21a). These side wall portions 72 face the side surfaces of the solid-state imaging element 30 to be mounted on the first placement surface 21a. In the example shown in FIG. 15, a pair of the side wall portions 72 are formed side by side in the Y-axis direction on one end side of the first placement surface 21a in the X-axis direction, and another pair of the side wall portions 72 are formed side by side in the Y-axis direction on the other end side of the first placement surface 21a in the X-axis direction.

Further, the base member 20F shown in FIG. 16 has side wall portions 73 in place of the side wall portions 25 in the first embodiment. The side wall portions 73 are formed so as to protrude in the Z-axis direction from the first placement surface 21a and the second placement surface 21b, and a pair of the side wall portions 73 extending in the X-axis direction are formed side by side in the Y-axis direction. In the present modified example, the pair of side wall portions 73 extend from the both sides of the first placement surface 21a to the both sides of the second placement surface 21b, and the first placement surface 21a and the second placement surface 21b are disposed between these side wall portions 25.

As the base members 20E and 20F shown in FIG. 15 and FIG. 16, the side wall portions of the base member are not limited to the configuration shown in FIG. 4, and may have varied shapes. In particular, as the base member 20F shown in FIG. 16, the side wall portions 73 extend from the sides of the first placement surface 21a to the sides of the second placement surface 21b, thereby it is possible to further increase the bending strength of the base member.

The sensor unit and the solid-state imaging device according to the present invention are not limited to the embodiments described above, and other various modifications thereof are possible. For example, the sensor unit and the solid-state imaging device which include the scintillator to image a radiation image are exemplified in the above-described embodiment and the respective modified examples, meanwhile, the sensor unit and the solid-state imaging device according to the present invention may include a configuration for imaging an optical image which reaches the solid-state imaging device from the outside.

Further, in the above-described embodiment, the first placement surface and the second placement surface along a predetermined plane (the XY plane in the embodiment) are shown as examples of the first placement region and the second placement region, meanwhile, the first placement region and the second placement region in the present invention are not limited to a flat surface, and may be, for example, a region having depressed and protruding portions, a region having a curved surface, or a region in which a groove, a dent, an opening, or the like is partially formed.

Further, in the above-described embodiment, the holes (the slits 24, 71) passing through the base member from its surface to its rear surface are formed between the first placement region and the second placement region, meanwhile, in place of these holes, a groove or a depressed portion (that is, a non-through hole) may be formed between the first placement region and the second placement region in the surface and/or the rear surface of the base member.

A sensor unit according to the above-described embodiment includes a base member which is a metallic member having a principal surface and a rear surface, and in which a first placement region and a second placement region whose height based on the rear surface is lower than the first placement region are formed on the principal surface, a solid-state imaging element which has a photodetecting surface, and a rear surface which is located on the opposite side of the photodetecting surface, and is disposed on the first placement region such that the rear surface and the first placement region face each other, and a signal readout semiconductor chip which is mounted on a wiring substrate disposed on the second placement region of the base member, and amplifies a signal output from the solid-state imaging element, to output the signal, the sensor unit in which the base member further has a side wall portion facing a side surface of the solid-state imaging element, the signal readout semiconductor chip and the solid-state imaging element are electrically connected to one another via a bonding wire, and the wiring substrate has a thermal via, and the signal readout semiconductor chip is thermally coupled to the base member via the thermal via.

Further, the sensor unit may be configured such that the base member further has a hole which is formed between the first placement region and the second placement region, and passes through the base member from the principal surface to the rear surface. By forming such a hole in the base member, it is possible to block heat conduction between the first placement region and the second placement region, and therefore, it is possible to more effectively reduce the effect on the solid-state imaging element due to heat generation from the semiconductor chip.

Further, the sensor unit may be configured to further include a scintillator which is disposed on the solid-state imaging element, and outputs light at an intensity corresponding to incident intensity of radiation to the photodetecting surface. In the above-described sensor unit, the solid-state imaging element is disposed on the first placement region such that the rear surface of the solid-state imaging element and the first placement region face each other. Accordingly, in some cases, radiation rays incident into the scintillator may partially pass through the solid-state imaging element, to reach the first placement region. Even in such a case, because the base member is made of metal in the above-described sensor unit, it is possible to prevent the radiation from passing through the base member. For this reason, for example, even in the case where a control substrate and the like are disposed on the rear surface side of the base member, it is possible to sufficiently protect the control substrate and the like from radiation.

Further, the sensor unit may be configured such that the base member has a first depressed portion which is formed with the first placement region serving as its bottom surface and the side wall portion serving as its side surface, and a second depressed portion which is formed with the second placement region serving as its bottom surface. Thereby, it is possible to sufficiently secure the thickness of the base member in the region other than the first placement region and the second placement region, and therefore, it is possible to further improve the radiation shielding effect by the base member. Further, the solid-state imaging element is fitted into the first depressed portion, thereby, it is possible to easily and accurately perform positioning of the photodetecting surface.

Further, the sensor unit may be configured such that a distance between the rear surface of the base member and the second placement region is greater than a depth of the second depressed portion, Thereby, it is possible to sufficiently secure the thickness of the base member in the first placement region and the second placement region as well, and therefore, it is possible to further improve the radiation shielding effect by the base member.

Further, the sensor unit may be configured such that the solid-state imaging element has a substrate which is transparent to a wavelength of incident light onto the photodetecting surface, and the side surface of the solid-state imaging element and the side wall portion are bonded to one another, thereby fixing the solid-state imaging element to the base member. Thereby, it is possible to omit placement of an adhesive agent between the rear surface of the solid-state imaging element and the first placement region of the base member, and therefore, it is possible to prevent an adhesive agent from being reflected on the photodetecting surface.

Further, the sensor unit may be configured such that the solid-state imaging element has a substrate which is transparent to a wavelength of incident light onto the photodetecting surface, and a light shielding film is formed on the rear surface of the solid-state imaging element. Thereby, it is possible to effectively prevent a member disposed between the solid-state imaging element and the base member from being reflected on the photodetecting surface, and therefore, for example, an adhesive agent may be disposed between the solid-state imaging element and the base member, to be able to more firmly fix the solid-state imaging element to the base member.

Further, a solid-state imaging device according to the above-described embodiment includes any of the sensor units described above, a housing in which the base member, the solid-state imaging element, and the signal readout semiconductor chip are housed, and a support member which supports the rear surface of the base member in the housing, and thermally couples the base member and the housing to one another. In accordance with this solid-state imaging device, it is possible to efficiently allow heat generated in the signal readout semiconductor chip to escape from the base member to the housing, and therefore, it is possible to more effectively reduce the effect on the solid-state imaging element.

Further, the solid-state imaging device may be configured such that an area proportion of the support member in a region within the rear surface of the base member corresponding to a back side of the second placement region is higher than an area proportion of the support member in a region within the rear surface of the base member corresponding to a back side of the first placement region. Thereby, it is possible to more efficiently allow heat generated in the signal readout semiconductor chip to escape from the base member to the housing.

INDUSTRIAL APPLICABILITY

The present invention is applicable as a sensor unit and a solid-state imaging device which are capable of reducing the effect on a solid-state imaging element due to heat generation from a semiconductor chip.

REFERENCE SIGNS LIST 1A to 1C—solid-state imaging device, 2A, 2B—sensor unit, 10—housing, 14, 16—window member, 15—frame, 20A to 20F—base member, 21—principal surface, 21a—first placement surface, 21b—second placement surface, 22—rear surface, 23—side surface, 24—slit, 25, 26, 28—side wall portion, 27—first depressed portion, 29—second depressed portion, 30—solid-state imaging element, 31—(glass) substrate, 32—photodetecting surface, 33—rear surface, 40—amplifier chip, 50—chip mounting substrate, 51—connector, 53—thermal via, 54—thermal conductive resin, 55—control substrate, 56—scintillator, 91, 94, 95—adhesive agent, 92, 96—bonding wire, 93—support member.

The invention claimed is:

1. A sensor unit comprising:
a base member being a metallic member having a principal surface and a rear surface, and in which a first placement region and a second placement region whose height based on the rear surface is lower than the first placement region and whose area is smaller than the first placement region are formed on the principal surface;
a solid-state imaging element having a photodetecting surface, and a rear surface which is located on the opposite side of the photodetecting surface, and being disposed on the first placement region such that the rear surface and the first placement region face each other; and
a signal readout semiconductor chip being mounted on a wiring substrate disposed on the second placement region of the base member, and amplifying a signal output from the solid-state imaging element, to output the signal, wherein
the base member further has a side wall portion facing a side surface of the solid-state imaging element,
the signal readout semiconductor chip and the solid-state imaging element are electrically connected to one another via a bonding wire,
the wiring substrate has a thermal via, and the signal readout semiconductor chip is thermally coupled to the base member via the thermal via, and
in the base member, the side wall portion is a metallic portion and extends along the alignment direction of the first placement region and the second placement region.

2. The sensor unit according to claim 1, wherein the base member further has a hole which is formed between the first placement region and the second placement region, and passes through the base member from the principal surface to the rear surface.

3. The sensor unit according to claim 1, further comprising a scintillator being disposed on the solid-state imaging element, and outputting light at an intensity corresponding to incident intensity of radiation to the photodetecting surface.

4. The sensor unit according to claim 3, wherein the base member has a first depressed portion which is formed with the first placement region serving as its bottom surface and the side wall portion serving as its side surface, and a second depressed portion which is formed with the second placement region serving as its bottom surface.

5. The sensor unit according to claim 4, wherein a distance between the rear surface of the base member and the second placement region is greater than a depth of the second depressed portion.

6. The sensor unit according to claim 1, wherein the solid-state imaging element has a substrate which is transparent to a wavelength of incident light onto the photodetecting surface, and the side surface of the solid-state imaging element and the side wall portion are bonded to one another, thereby fixing the solid-state imaging element to the base member.

7. The sensor unit according to claim 1, wherein the solid-state imaging element has a substrate which is transparent to a wavelength of incident light onto the photodetecting surface, and
a light shielding film is formed on the rear surface of the solid-state imaging element.

8. A solid-state imaging device comprising:
the sensor unit according to claim 1;
a housing in which the base member, the solid-state imaging element, and the signal readout semiconductor chip are housed; and
a support member which supports the rear surface of the base member in the housing, and thermally couples the base member and the housing to one another.

9. The solid-state imaging device according to claim 8, wherein an area proportion of the support member in a region within the rear surface of the base member corresponding to a back side of the second placement region is higher than an area proportion of the support member in a region within the rear surface of the base member corresponding to a back side of the first placement region.

10. A sensor unit comprising:
a base member being a metallic member having a principal surface and a rear surface, and in which a first placement region and a second placement region whose height based on the rear surface is lower than the first placement region and whose area is smaller than the first placement region are formed on the principal surface;
a solid-state imaging element having a photodetecting surface, and a rear surface which is located on the opposite side of the photodetecting surface, and being disposed on the first placement region such that the rear surface and the first placement region face each other; and a signal readout semiconductor chip being mounted on a wiring substrate disposed on the second placement region of the base member, and amplifying a signal output from the solid-state imaging element, to output the signal, wherein the base member further has a side wall portion facing a side surface of the solid-state imaging element, the signal readout semiconductor chip and the solid-state imaging element are electrically connected to one another via a bonding wire, the wiring substrate has a thermal via, and the signal readout semiconductor chip is thermally coupled to the base member via the thermal via, and in the base member, as the side wall portion being a metallic portion, at least two side wall portions are formed side by side in a direction intersecting with the alignment direction of the first placement region and the second placement region.

11. A sensor unit comprising:

a base member being a metallic member having a principal surface and a rear surface, and in which a first placement region and a second placement region whose height based on the rear surface is lower than the first placement region and whose area is smaller than the first placement region are formed on the principal surface;

a solid-state imaging element having a photodetecting surface, and a rear surface which is located on the opposite side of the photodetecting surface, and being disposed on the first placement region such that the rear surface and the first placement region face each other; and a signal readout semiconductor chip being mounted on a wiring substrate disposed on the second placement region of the base member, and amplifying a signal output from the solid-state imaging element, to output the signal, wherein the base member further has a side wall portion facing a side surface of the solid-state imaging element, the signal readout semiconductor chip and the solid-state imaging element are electrically connected to one another via a bonding wire, the wiring substrate has a thermal via, and the signal readout semiconductor chip is thermally coupled to the base member via the thermal via, and in the base member, as the side wall portion being a metallic portion, at least two side wall portions are formed along the alignment direction of the first placement region and the second placement region.

* * * * *